United States Patent [19]

Nomura et al.

[11] E Patent Number: Re. 33,669

[45] Reissued Date of Patent: Aug. 20, 1991

[54] ALIGNING EXPOSURE METHOD

[75] Inventors: Noboru Nomura, Fukakusanakanoshi; Koichi Kugimiya, Toyonaka; Takayoshi Matsumura, Hirakata; Taketoshi Yonezawa, Osaka, all of Japan

[73] Assignee: Matsushita Electric Industrial Co., Ltd., Osaka, Japan

[21] Appl. No.: 296,721

[22] Filed: Jan. 12, 1989

Related U.S. Patent Documents

Reissue of:

[64] Patent No.: 4,636,077
Issued: Jan. 13, 1987
Appl. No.: 599,734
Filed: Apr. 12, 1984

[30] Foreign Application Priority Data

| | | | |
|---|---|---|---|
| Apr. 15, 1983 | [JP] | Japan | 58-67329 |
| May 31, 1983 | [JP] | Japan | 58-97085 |
| Sep. 21, 1983 | [JP] | Japan | 58-175636 |
| Sep. 22, 1983 | [JP] | Japan | 58-175353 |
| Sep. 22, 1983 | [JP] | Japan | 58-175354 |
| Sep. 22, 1983 | [JP] | Japan | 58-175355 |
| Sep. 22, 1983 | [JP] | Japan | 58-175356 |

[51] Int. Cl.[5] ..... G01B 9/02

[52] U.S. Cl. ..... 356/356; 356/363; 356/400

[58] Field of Search ..... 356/354, 355, 356, 363, 356/399, 400

[56] References Cited

U.S. PATENT DOCUMENTS

| | | | |
|---|---|---|---|
| 4,390,279 | 6/1983 | Suwa | 356/363 X |
| 4,423,959 | 1/1984 | Nakazawa et al. | 356/363 X |
| 4,459,026 | 7/1984 | Pekelsky | 356/363 X |

FOREIGN PATENT DOCUMENTS

| | | | |
|---|---|---|---|
| 207805 | 12/1982 | Japan | 356/356 |

*Primary Examiner*—Davis L. Willis
*Assistant Examiner*—Matthew W. Koren
*Attorney, Agent, or Firm*—Spencer & Frank

[57] ABSTRACT

Disclosed [in] *is* an aligning and exposing method suitable for use in the production of LSIs. Coherent ray beams are applied from two directions to form *an* interference fringe through interference of the coherent rays. A diffraction grid is disposed in the optic paths of the ray beams substantially in parallel with the interference fringe. The ray beams reflected [and] *or* transmitted by the grid are converged by a lens system and the intensities of the ray beams are measured to detect the relative position between the interference fringe formed by two coherent ray beams and the diffraction grid, thereby to permit a highly accurate alignment of fine semiconductor element. The pitch of the grid on the substrate is selected to be n (n being an integer) times as large as the pitch of the interference fringe, so that the grid for alignment purpose is formed simultaneously with the formation of the LSI pattern by photolithographic technic. With this method, it is possible to attain a high degree of accuracy of alignment, and to conduct the subsequent exposure using the same ray beam source as that used for the alignment.

30 Claims, 22 Drawing Sheets

ALIGNING EXPOSURE METHOD

Matter enclosed in heavy brackets [ ] appears in the original patent but forms no part of this reissue specification; matter printed in italics indicates the additions made by reissue.

BACKGROUND OF THE INVENTION

The present invention relates to an aligning method which ensures a high precision of alignment and which is suited to the aligning apparatus for producing *a* large-scale integrated semiconductor device (referred to as "LSI", hereinunder). The invention is concerned also with an exposure method for making a transfer of a pattern by the aligning method mentioned above.

FIGS. 1a and 1b show an example of conventional aligning methods. More specifically, FIG. 1a shows an example of an aligning pattern on a photo mask. In this example, a transfer pattern $\alpha 1$ for the aligning pattern is formed on a wafer by means of radial lines of a constant line width, while FIG. 1b shows how a further alignment is made on the aligning pattern formed on the wafer with the same pattern. Namely, the shadow $\alpha 2$ of an aligning mark formed on a photo mask is aligned with the pattern $\alpha 1$ formed already on the wafer. This aligning method can provide a degree of aligning precision on the order of $\pm 0.3$ $\mu$m which is quite unacceptable for the alignment of LSI having a gate length of less than 1 micron. In fact, LSIs of 0.5 micron rule require a high degree of aligning precision of 0.05 $\mu$m which can never be achieved by the conventional aligning method.

Austin et al proposes, in Applied Physics Letters Vol. 31, No. 7, p. 428, 1977, an aligning method making use of a double grid. In this method, as shown in FIG. 2, an incoming laser beam is applied to a photo mask 2 and is diffracted by a grid 3 formed on the photo mask 2. The diffracted ray is diffracted once again by a grid 5 formed on the wafer 4 to obtain diffracted ray beans 6, 7, 8 . . . These diffracted ray beams 6, 7 and 8 can be expressed as (0, 1), (1, 1), (−1,2) . . . by binary representation in terms of the order of diffraction on the photo mask and the order of diffraction on the wafer. These diffracted beams are focussed on a point by means of a lens for the measurement of the ray intensity. The diffracted ray beam has a ray intensity distribution in bilateral symmetry with respect to the incoming laser beam 1, so that the alignment of the photomask 2 with the wafer 4 can be attained by making the intensities of diffracted beams observed on both sides equal together. It is said that this aligning method can provide a degree of aligning precision of several hundreds of Å. In this method, however, the alignment between the photo mask 2 and the wafer 4 is largely affected by the distance D between the photo mask 2 and the wafer 4, so that it is necessary to control the distance D with a high degree of accuracy. In addition, this method requires an impractically complicated apparatus because the aligning operation has to be made with the photo mask 2 and the wafer 4 being positioned close to each other with precise control of the distance D therebetween.

In order to align elements having a line width of sub-micron order, it has been proposed to observe the discharge of secondary electron from the elements This, method, however, is also impractical because this method cannot be carried out in the atmosphere and, hence, the through-put is too small in the production of LSI.

SUMMARY OF THE INVENTION

Accordingly, it is an object of the invention to provide a position detecting method possibly used in an aligning method which permits alignment of minute patterns, particularly accurate and easy alignment of patterns of photo *mask* and wafer in the production of LSIs, within the atmosphere with a simple arrangement.

It is another object of the invention to provide an aligning method which permits alignment of minute patterns of photo mask and wafer in the production of LSIs by a simple arrangement within the atmosphere, as well as a method of exposure which is conducted after the alignment.

According to one aspect of the invention, coherent ray beams are applied from two directions such that these two ray beams interfere with each other to form interference fringes. A grid is disposed in the paths of the ray beams in parallel with the interference fringe, and the ray beams reflected by or transmitted through this grid are focused through a lens. By this method in which, by measuring the intensity of the thus focused ray, the relative position between the interference fringe of the two ray beans and the grid is detected, the alignment of minute semiconductor elements can be made with a high degree of accuracy. Furthermore, by selecting the pitch of the grid on a substrate to be n times as large as the pitch of the interference fringes (n being an integer), the grid for alignment is formed by a photolithographic technique simultaneously with the formation of the LSI pattern, thereby permitting the alignment with high accuracy.

According to a further aspect of the invention, there is provided an aligning method for attaining alignment between two substrates, e.g. a reticle and a wafer. A coherent first ray beam is applied to the reticle on which a diffraction grid for a first ray beam is provided. The first ray beam is diffracted by this grid into a second ray beam which in turn is applied to the wafer to which is also applied a third ray beam which can interfere with the second ray beam. By measuring the intensity of the ray beam reflected by or transmitted through the diffraction grid on the wafer, it is possible to attain alignment between the [interfere] *interference* fringe of two ray beams applied to the wafer and the grid formed on the wafer.

According to a still further aspect of the invention, there is provided an aligning method in which a coherent first ray beam is applied to the first one of two substrates to be aligned with each other. The thus applied first ray beam is diffracted into a second ray beam by a first diffraction grid provided on the first substrate. The second ray beam obtained through diffraction by the first diffraction grid is applied to the second substrate to which also is applied a reference third ray beam which can interfere with the second ray beam. The second and the third ray beams impinge upon a second diffraction grid and a fourth ray beam, which is reflected by or transmitted through the second diffraction grid, is lead to a photo detecting means adapted to measure the intensity of this ray beam. By this measurement, the relative position between the second diffraction grid on the second substrate and the interference fringe of the second and third ray beams applied to the second substrate is detected to permit the alignment between the first substrate and the second substrate.

An aligning apparatus for carrying out the method of the invention comprises, for example, a beam splitter adapted to split a ray beam having coherency into two ray beams, two reflecting mirrors arranged to apply the reflected ray beam and transmissed ray beam from the beam splitter to a grid on a wafer at a substantially equal angle $\theta$, two photo-detectors adapted to receive the reflected ray diffracted by the grid on the wafer through respective slits, and a ray intensity measuring circuit adapted to measure, from the outputs of two photo-detectors, the degree of parallelism and the relative position in the pitch direction between the grid and the interference fringe of two ray beans. According to this arrangement, it is possible to measure the degree of parallelism, as well as the relative position in the pitch direction, between the interference fringe of two ray beams and the grid and, hence, to conduct the alignment of a semiconductor element at a high accuracy.

In addition, the invention permits also an exposure after the accomplishment of accurate alignment through detection of the relative position between the interference fringe of two ray beams and the grid.

DESCRIPTION OF THE PREFERRED EMBODIMENTS

Figure 1A:
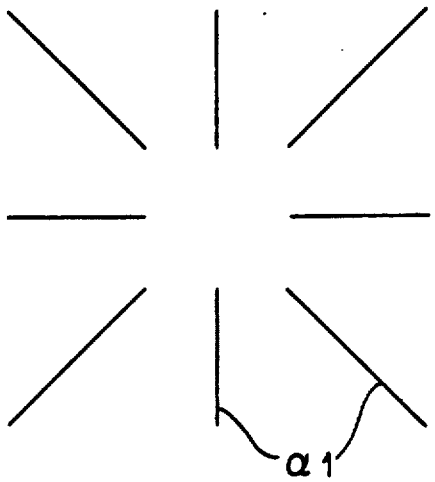
FIG. 1a (Prior Art)
FIG. 1a is a plan view of a conventional aligning mark on a photo mask.
Figure 1B:
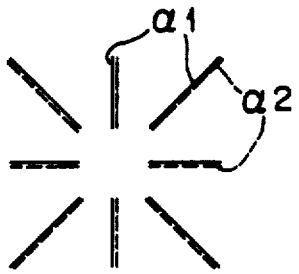
FIG. 1b (Prior Art)
FIG. 1b is a plan view of a wafer illustrating a conventional aligning method.
Figure 2:
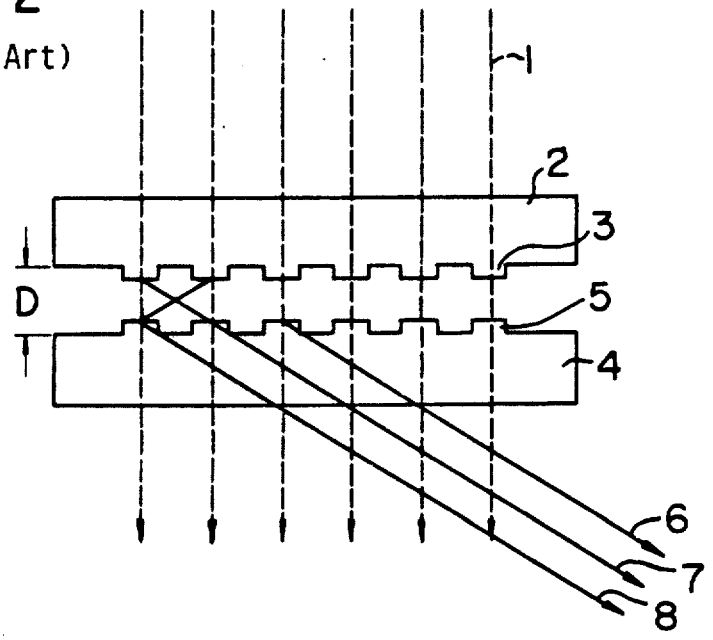
FIG. 2 (Prior Art)
FIG. 2 is an illustration of a conventional aligning method.
Figure 3:
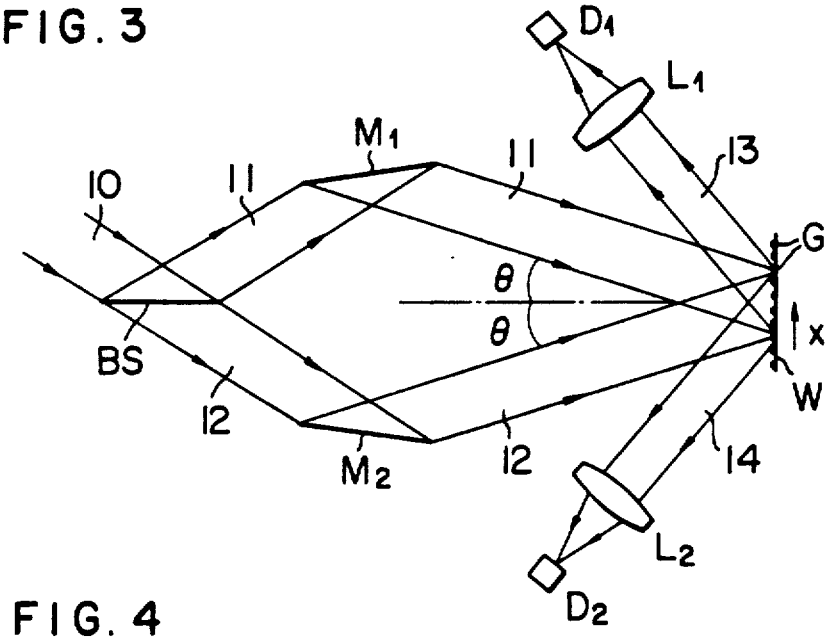
FIG. 3 is a schematic illustration of a reflection type aligning system in accordance with the invention.

FIG. 3 shows a position detecting system for carrying out an aligning method of the invention, provided with a holographic exposure device and a photodetector in accordance with the invention. A coherent ray beam 10 from a laser source is applied to a beam splitter BS which makes an amplitude split of the beam into a reflected ray beam 11 and a transmitted ray bean 12 of the substantially equal intensity. These ray beams 11 and 12 impinge upon and are reflected by reflecting mirrors $M_1$ and $M_2$ so as to impinge upon a wafer W which is a substrate of a semiconductor. The constituents BS, $M_1$, $M_2$ and W are so arranged that the ray beams reflected by the reflecting mirrors $M_1$ and $M_2$ impinge upon the surface of the wafer W at a substantially equal incident angle $\theta$. The wafer W has a grid G formed therein. The reflected ray beam after diffraction by the grid G, represented by 13 and 14 respectively, come into photodetectors $D_1$ and $D_2$ through lenses $L_1$ and $L_2$, respectively. The grid G may be constituted by a repetitional pattern formed regularly on a predetermined region of the wafer W.

Representing the wavelength of the laser beam by $\lambda$ and the pitch of the interference fringes of reflected ray beams 11, 12 from mirrors $M_1$, $M_2$ by $\Lambda$, the interference fringes formed on the wafer can be expressed by $$\Lambda = \lambda / 2 \sin \theta$$

The grid G having a pitch substantially equal to the pitch $\Lambda$ of the interference fringe produces a ray beam which is formed by a wave-surface splitting of a ray beam that is obtained through interference between two ray beams 11 and 12. The ray beams obtained through the wave-surface splitting are focused through the lenses $L_1$ and $L_2$ and are made to interfere with each other. By so doing, it is possible to obtain a ray intensity information concerning the positional relationship between the interference fringes of two ray beams and the grid G.

The intensity I of the ray beam observed by the photo-detectors $D_1$ and $D_2$ are given by the following equation (1).

$$I = U_A^2 + U_B^2 + U_a^* U_B + U_A \cdot U_B^* \quad (1)$$

where, $U_A$ and $U_B$ represent, respectively, amplitude intensities of the ray beams 11 and 12, while $U_A^*$ and $U_B^*$ represent the conjugate complex amplitudes.

Thus, $U_A$ and $U_B$ are given by the following equation (2).

$$U_A^2 = A^2 \left( \frac{\sin N \frac{\delta A}{2}}{\sin \frac{\delta A}{2}} \right)^2 \cdot U_B^2 = B^2 \left( \frac{\sin N \frac{\delta B}{2}}{\sin \frac{\delta B}{2}} \right)^2 \quad (2)$$

$$U_A^* \cdot U_B + U_A \cdot U_B^* = 2 \cdot A \cdot B \cos \left\{ (N-1) \frac{\delta A - \delta B}{2} + Kx(\sin\theta_A - \sin\theta_B) \right\} \times \frac{\sin N \frac{\delta A}{2} \cdot \sin N \frac{\delta B}{2}}{\sin \frac{\delta A}{2} \cdot \sin \frac{\delta B}{2}}$$

where, A and B represent constants, N represents the number of grids, $\delta A$ and $\delta B$ represents the optical path difference between rays diffracted by two adjacent grids, x represents the relative positional relationship between the grid and the interference fringes of ray beams 11 and 12 and $\theta_A$ and $\theta_B$ represent the angles formed between a line normal to the wafer and the ray beams 11 and 12, respectively.

Figure 5:
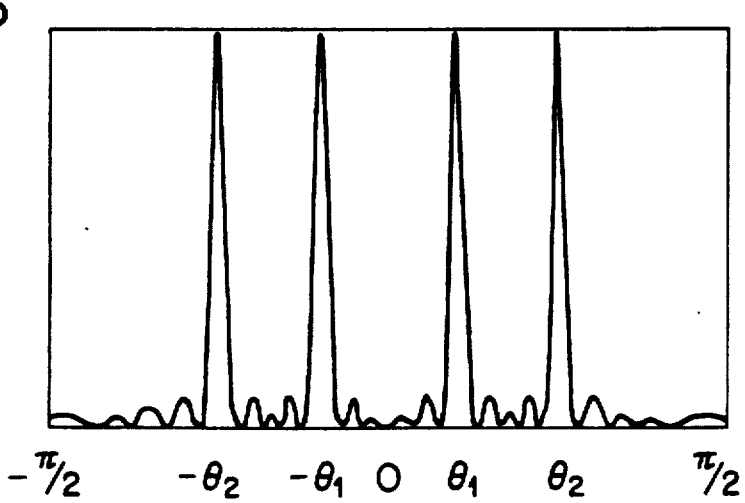
FIG. 5 is a diagram showing the observation angle dependency of the ray intensity observed by a photo-detector.
Figure 6:
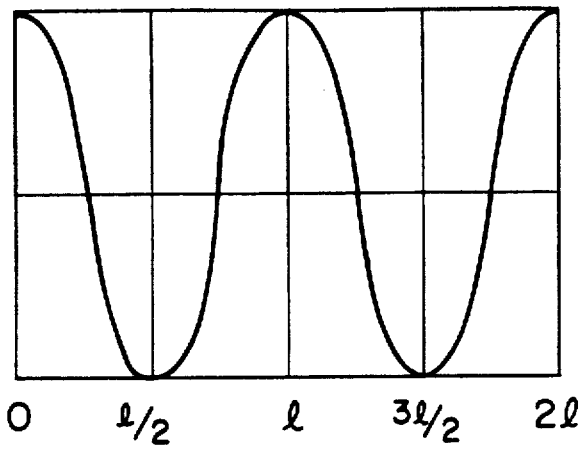
FIG. 6 is a diagram showing the deviation dependency of the ray intensity observed by a photo-detector.

FIG. 5 shows the observation angle dependency of the ray intensity I. Four peaks appear while the observation angle is continuously changed between $-\pi/2$ and $\pi/2$ past 0. The diffracted rays of the 0 order of the incident ray beam 11 and 12 are overlapped together in the peaks appearing at the angles $-\theta_1$ and $\theta_1$, while the peaks appearing at angles $-\theta_2$, $\theta_2$ contain diffracted ray beams of the first order of the incident ray beams 11 and 12. These diffracted ray beams contain the positional information concerning the relative position between the interference fringe formed by the ray beams 11, 12 and the grid on the wafer. FIG. 6 shows how the ray intensity I is changed when the relative position x between the interference fringe of the ray beams 11, 12 and the grid is varied while the photodetector is fixed at a position where a peak is observed in FIG. 5. It will be seen that the ray intensity is changed periodically as the relative position x is changed by a distance equal to the pitch 1 of the grid. It is, therefore, possible to obtain the relative position between the interference fringe and the grid by observing the ray intensity.

From this description it will be understood that the relative position can be detected practically by a single photodetector, although the arrangement shown in FIG. 3 employs two photo-detectors. The use of two photodetectors at mutually conjugate positions as shown in FIG. 3, however, offers the following advantages. Namely, since the intensity of the diffracted ray varies due to the difference of diffraction efficiency of the tapered portions of concavity and convexity of the grid, it is possible to read the positional information more accurately by observing the difference between the outputs from two photodetectors. Furthermore, through the observation of the difference of the output, it is possible to delete the noise coming into respective photodetectors so that the detection of position can be made at a higher accuracy.

If the grid G is a blaze grid, the ray beams coming into two photodetectors have an [asymmetry] *asymmetrical* relationship to each other, even if the grid G and the ray beams 11, 12 are set in symmetry. Consequently, only one of the photodetectors can produce a large output while the other can produce an output the level of which is too low for the level of the noise. Thus, the accuracy of the observation differs extremely depending on the manner of setting of the blaze grid if the observation is made only through one of the photodetectors. In such a case, the influence of the manner of setting of the blaze grid can be eliminated and the relationship between the ray intensity and the position can be determined to higher accuracy by observing the sum of the outputs from two detectors.

Figure 4:
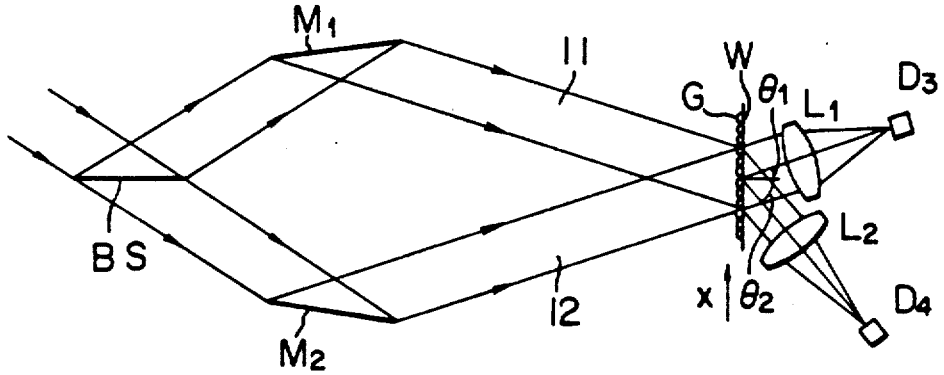
FIG. 4 is a schematic illustration of a transmission type aligning system in accordance with the invention.

FIG. 4 shows the case where the ray beams led to the photodetector are transmitted ray beams. In this case, the optical path from the ray beam source to the grid is indentical to that in FIG. 3. The ray beams which have been transmitted through the grid G form high intensities of diffracted ray beam at angular positions $\theta_1$ and $\theta_2$. More specifically, at the angular position $\theta_1$, the ray beam 12 is received directly and the ray beam interfered with the ray beam diffracted from the ray beam 11 is introduced to the photodetector 3 through the lens $L_1$. By setting another photodetector at the conjugate position, a ray intensity conjugate to the photodetector D3 is observed. Then, by observing the difference [and] *or* the sum of the outputs of conjugate photodetectors, it is possible to enjoy the same advantage as that described before in connection with the first embodiment.

By setting the photodetector at the angular position $\theta_2$, it is possible to observe the ray beam which is produced on the photodetector $D_4$ as a result of interference between the diffracted ray beam of $-1$ order of the ray beam 11 and the diffracted ray beam of $-2$ order of the ray beam 12 applied through the lens $L_2$. In this case, all of the observed rays are diffracted ray beams so that the noise, i.e. the ray beams from the portion devoid of the grid, is not allowed to come into the photodetector, unlike the case where the photodetector is located at the position $D_3$. By measuring the interference of ray beam at the position $D_4$, therefore, it is possible to detect the position more accurately than the case where the observation is made at the position $D_3$.

By placing the photodetector at the focal point of the condenser lens for effecting the interference, every part of the ray beam impinging upon the lens is put into interference so that a high sensivitiy of ray intensity is obtained. On the other hand, if the arrangement is such that the interference ray beam is measured by way of a slit while offsetting the photodetector from the focal point of the lens, it is possible to measure the interference of a part of the ray impinging upon the lens. In such a case, the accuracy is improved although the sensitivity is lowered.

In a third embodiment, the relative position x between the grid G and the interference fringe of two ray beams is varied and the relative position is compared with the maximum or minimum value of the ray intensity.

In the first and second embodiments described before, the relative position x between the grid G and the interference fringe of two ray beams is obtained through measuring the ray intensity. This ray intensity, however, is a cosine function so that there is a practical limit in obtaining the higher accuracy of the positional information through enhancement of accuracy of reading of the ray intensity without changing the pitch l of the grid. A more accurate detection of position is possible by memorizing the grid positions where the maximum and/or minimum ray intensity is obtained, calculating the feed pitch and dividing the calculated feed pitch. The observation of the feed pitch is preferably made by a scale proportional to the feed pitch, e.g. angle, length and the like.

In a fourth embodiment, at least two photodetecting means are provided for independent observation of ray intensities. In view of that, the direct incidence of the ray of 0 order to the photodetector $D_3$ in the second embodiment, a portion devoid of the grid is provided in the region of the grid in the fourth embodiment, the photodetectors are offset from the focal point to make the ray beams interfere through slits to obtain intensity of interference of part of the rays. With this arrangement, it is possible to effect the alignment by comparing the outputs from two photodetectors. On the other hand, a photodetector constituting the aforementioned other system is used as the photodetector $D_4$. With this arrangement, it is possible to obtain the parallelism and alignment between the interference fringe and the grid G. Thus, the aligning operation can be accomplished in a shorter period of time by conducting the alignment by two systems.

According to the invention, it is possible to effect the alignment of photo mask in the same manner as that described hereinbefore, by forming a grid in the photo mask.

As above-mentioned, FIG. 4 shows the arrangement of an aligning system which is used when the wafer is of the type which permits transmission of a ray therethrough. In this system, the photodetectors $D_3$ and $D_4$ and the optic systems $L_1$ and $L_2$ are disposed behind the wafer W.

Figure 7:
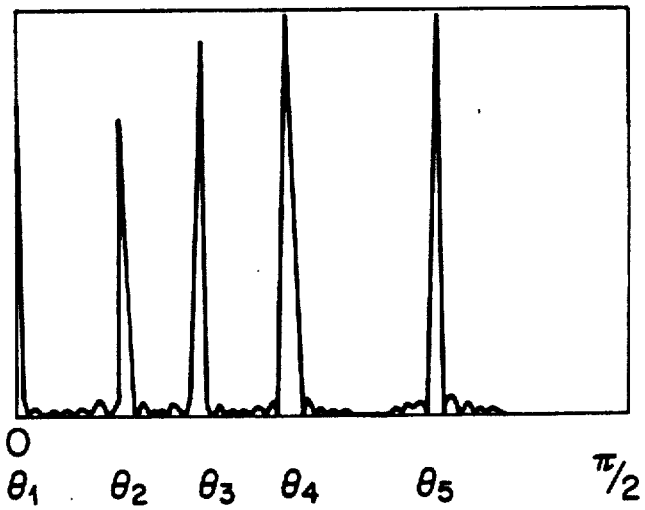
FIG. 7 is a diagram showing the angle dependency of the ray intensity observed in the aligning method of the invention employing a grid having a pitch which is n (n being an integer) times as large as the pitch of the interference fringe.

FIG. 7 shows an observation angle-dependency of the ray intensity I, as obtained when the pitch of the interference fringe is 1 $\mu$m, while the pitch of the grid is 2 $\mu$m. As will be seen from the curve showing the ray intensity I, sharp peaks of the ray intensity appears only when the pitch of the grid is n (n being an integer) times as large as the pitch of the interference fringe. It will be seen that five peaks appear as the observation angle is continuously changed between 0 and $\pi/2$. Diffracted ray beam of 0 order of the incident rays 11 and 12 are superposed in the peak appearing at $\theta_2$, while the peak $\theta_4$ contains the diffraction ray beam of the first order of the peak of $\theta_4$. The peaks appearing in the angular range of between $\theta_1$ and $\theta_5$ contain the information concerning the relative position between the interference fringe and the grid on the wafer.

Figure 8:
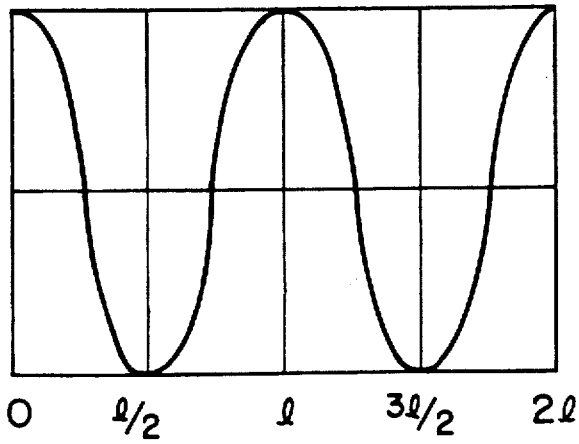
FIG. 8 is a diagram showing the grid position dependency of the ray intensity as observed in the aligning method of the invention.

FIG. 8 shows how the ray intensity I is changed as the relative position x between the grid on the wafer and the interference fringe formed by the ray beams 11 and 12 is changed while the photodetector is fixed at the position where the peak is obtained in FIG. 4. The ray intensity is periodically changed corresponding to the change of the relative position x by the distance equal to the pitch l of the grid.

Figure 9:
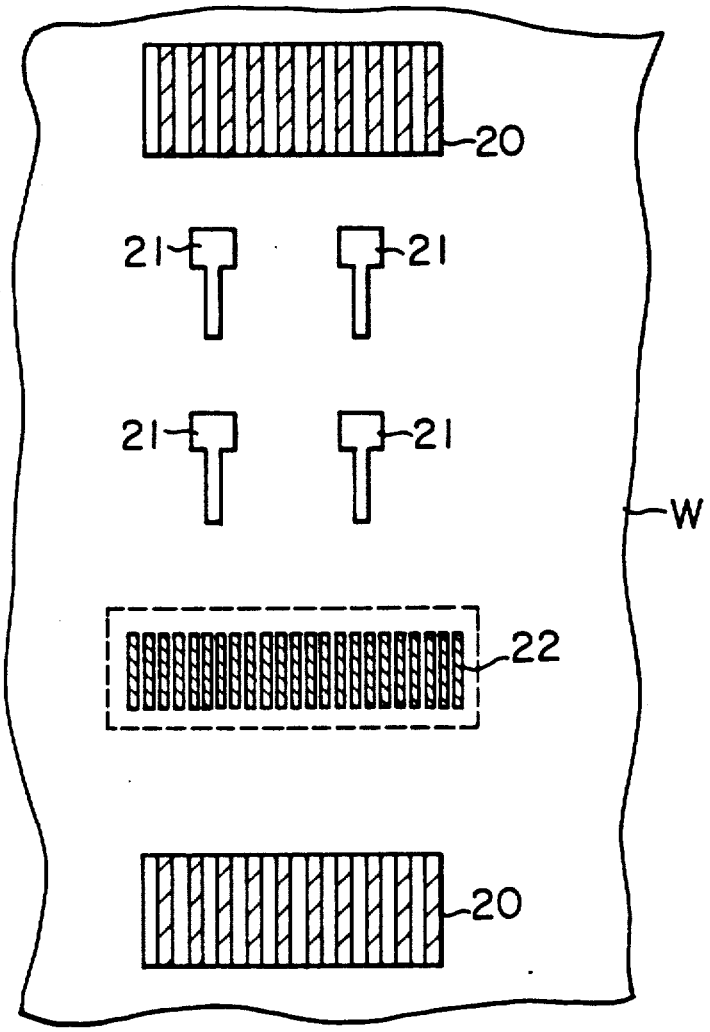
FIG. 9 is a plan view of a wafer illustrating the alignment of the pattern of the wafer.

In the actual formation of the LSI pattern, the aligning operation is made to attain an alignment between the pattern of the circuit element portion formed on the wafer and the interference fringe of two ray beams to be exposed. FIG. 9 shows how this aligning operation is actually conducted. A diffraction grid 20 and the gate pattern 21 are formed on the wafer W by a conventional photolithographic technique. The diffraction grid 20 is precisely positioned with respect to the gate pattern 21 and can be provided, for example, in the margin or scribe line for severance of adjacent chips from each other. The grid 20 has a line width which is n (n being an integer) times as large as the interference fringe pitch falling within such a range as permitting an accurate formation by a light ray exposure or an X-ray exposure. The interference fringe 22 is applied to the whole part of the wafer or to the aligning grid 20, thereby to permit the alignment between the grid 20 and the interference fringe 22, as well as the alignment between the pattern 21 and the interference fringe 22.

Figure 10:
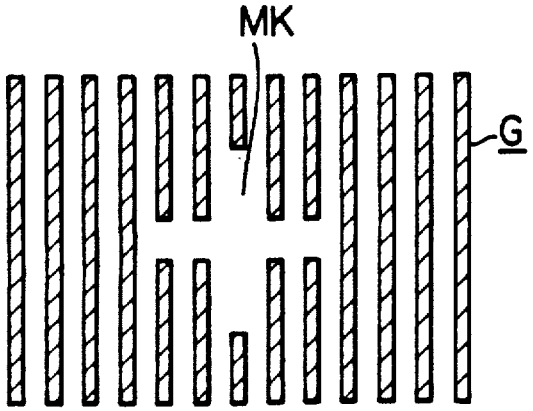
FIG. 10 is a plan view illustrating a method in which the aligning method of the invention is used in combination with a conventional aligning mark.
Figure 11A:
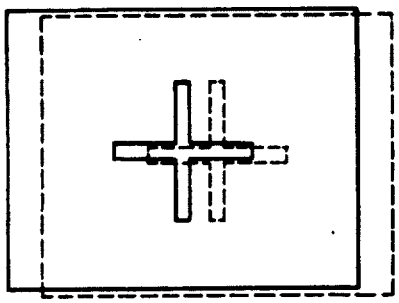
FIGS. 11a and 11b are illustrations of alignment achieved by the aligning marks as shown in FIG. 10.
Figure 11B:
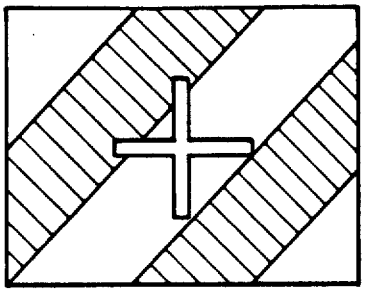

FIG. 10 shows an aligning pattern consisting of a combination of a conventional aligning mark MK and the grid G. As will be understood from this Figure, a crusiform-shaped aligning mark MK is formed in the pattern of the grid G. As two ray beams are applied to this pattern having the crusiform-shaped aligning mark, the diffracted ray beam forms the pattern shown in FIG. 10 [form] *from* an image which is constituted by a rectangular, bright pattern having a crusiform-shaped dark pattern. If the alignment is insufficient, the crusiform-shaped dark pattern is doubled as shown in FIG. 11a. The adjustment, therefore, is made to make the two crusiform-shaped patterns superposed with each other as shown in FIG. 11b. By providing the photodetecting means corresponding to the crusiform-shaped pattern, it is possible to conduct the alignment of the pattern in the same way as that in the conventional aligning method. It is thus possible to effect an approximate alignment on the order of 0.3 micron by the same aligning method as that of the conventional aligning method. After the completion of the alignment in the manner described hereinbefore, a Moire fringe comes to appear in the bright rectangular pattern, and the alignment can be achieved at a high degree of accuracy in a short period of time by making use of this fringe.

As has been described, with the described embodiments of the aligning method of the invention, it is possible to attain a highly accurate alignment between the pattern on the wafer and the pattern to be exposed in the exposure system for the production of semiconductor devices. The exposure which is conducted following the aligning operation can be made by the exposure of *an* interference fringe of two ray beams by for example *a* holographic method, conventional photolighography, scale-down projection exposure, X-ray exposure, electron-beam exposure and so forth.

Figure 12:
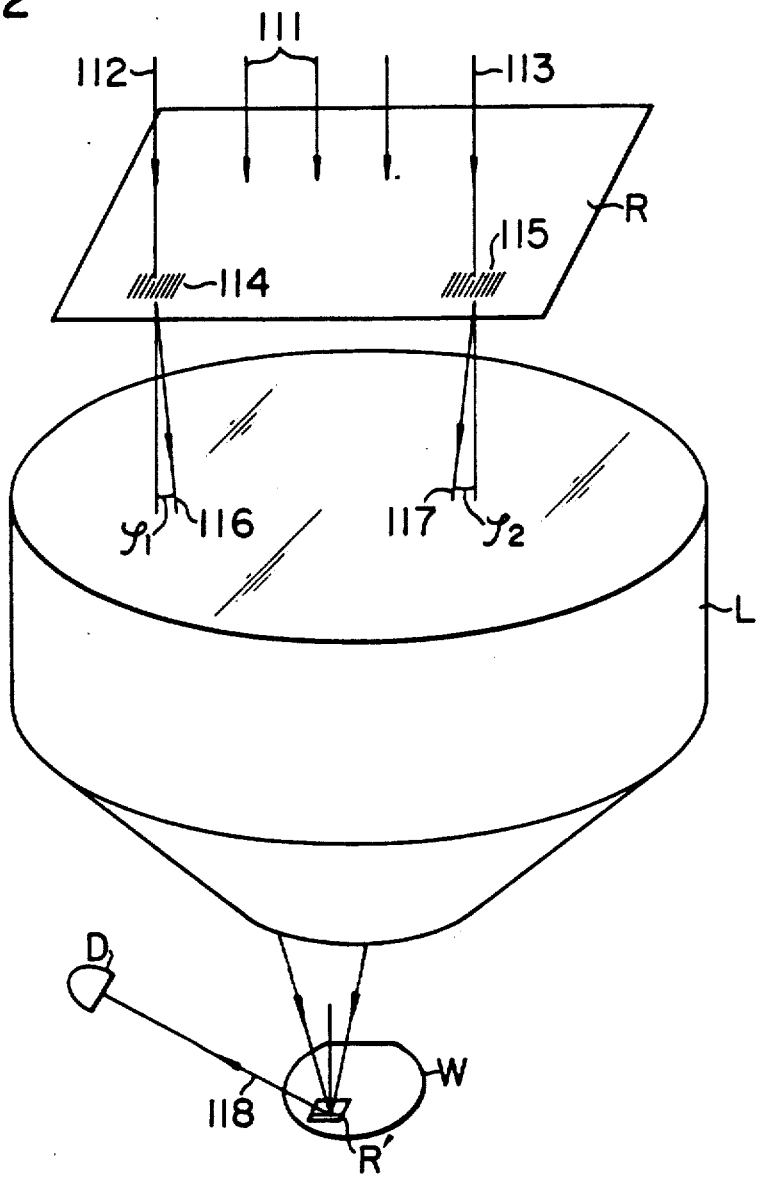
FIG. 12 is an illustration of an embodiment of the aligning method of the invention for achieving an alignment between a wafer and a reticle.

FIG. 12 shows the principle of a scale-down projection exposure system carrying out an embodiment of the aligning method of the invention, as well as an arrangement for attaining an alignment between a reticle and a wafer.

An explanation will be made first as to the arrangement for ordinary scale-down projection exposure. The exposure system includes a ray source, reticle R, lens system L and a semiconductor wafer W which are disposed in the mentioned order. The parallel ray beam 111 coming from the ray source is partially intercepted by the pattern on the reticle R and the ray beam from the reticle R having a predetermined light-and-shade pattern is condensed by the lens system L to form a projection image R' of the reticle on the wafer.

The arrangement used for the alignment is as follows. Namely, a coherent ray such as a laser beam is applied to a beam splitter which effects an amplitude aplitting into two ray beams 112, 113 of a substantially equal ray intensity. The two ray beams 112, 113 are applied to diffraction grids 114, 115 which are provided on the reticle R. The arrangement of the reticle R can be represented by the phases and angles $\Phi_1$, $\Phi$, of the incident ray beam and the diffracted ray beam. The constituents such as R, L and W are so arranged that the diffracted rays 116, 117 from the reticle R pass through the lens system L and interfere with each other on the wafer W. As will be seen from FIG. 13, a diffraction grid G is formed on a portion of the wafer W, and the interference fringe F of these two ray beams is formed on this grid G. The reflected ray 118 after the diffraction by the grid G is led to the photodetector D. As shown in FIG. 14 by way of example, the grid G on the wafer is preferably constituted by a regular repetitional pattern provided on a predetermined region of the wafer.

Figure 13:
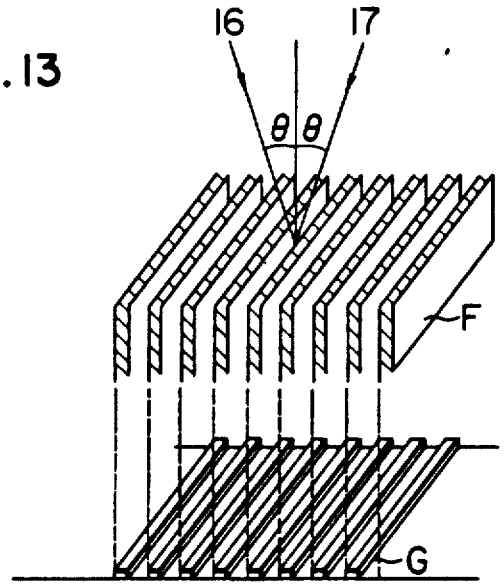
FIG. 13 is an illustration of the relative position between a grid and an interference fringe of two ray beams used in the aligning method of the invention.
Figure 14:
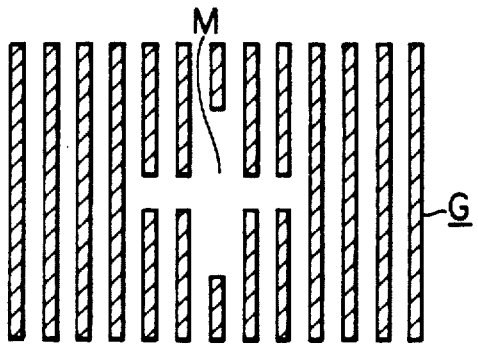
FIG. 14 is a plan view of an example of a grid on a wafer, used in the aligning method of the invention.

As will be seen from FIG. 13, the interference fringe F formed by interference between two ray beams has a pitch. A corresponding to the incidence angle $\theta$ of a regular pitch. The grid G, which has a pitch substantially equal to the pitch $\Lambda$ of the interference fringe, provides a ray beam which is obtained by diffracting the ray formed by interference between two ray beams 116 and 117. With this diffracted ray beam, it is possible to obtain a ray intensity information representing the positional relationship between the interference fringe F of two ray beams and the grid G. The intensity of the ray observed on the photodetector D is given by the equation (1) and the principle of the alignment is same as that of the embodiments described before.

Figure 15:
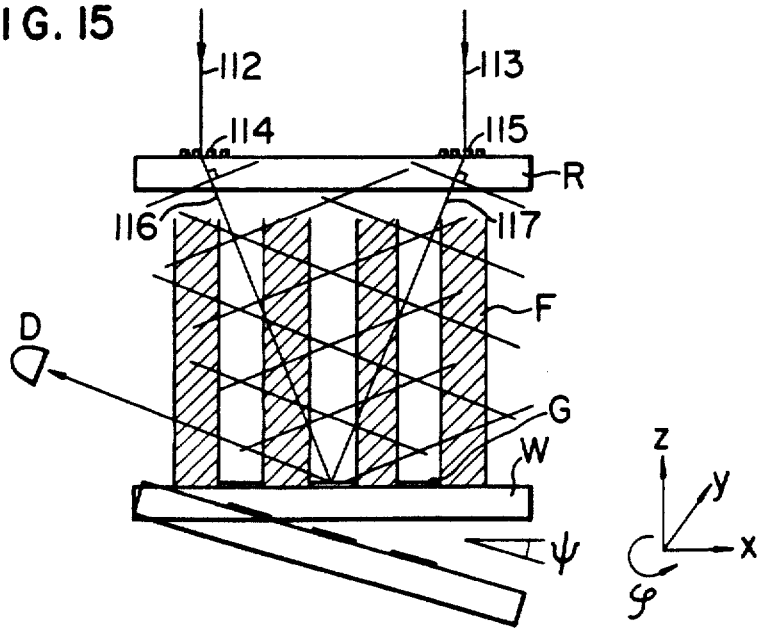
FIG. 15 is an illustration of arrangement of constituents of an aligning system for carrying out the aligning method of the invention, as well as the operation of these constituents.

An explanation will be made hereinunder as to the procedure for attaining alignment between the reticle R and the wafer W, with specific reference to FIG. 15.

Two ray beams coming into the reticle R impinge upon the reticle R at a right angle thereto. The arrangement is such that two ray beams 112, 113 impinge upon the grids 114 and 115 on the reticle. The grids 114 and 115 transmits two ray beams and emits diffracted rays 116 and 117. Since the optic system is arranged such that the phases of two ray beams 112, 113 impinging upon the grids 114, 115 are equal to each other, the wave surfaces of the rays 116, 117 diffracted by the grid are in symmetry with each other. As the two ray beams 116, 117 of the same phase intersect on the surface of the wafer W at an intersecting angle of $2\theta$, an interference fringe of regular change of light-and shade, denoted by F in FIG. 15, is formed and the position of the interference fringe F is fixed at the position where the wave surfaces intersect each other. The diffraction grid G (see FIG. 15) formed on the wafer W is aliged with the interference fringe F at the fixed position.

The relative rotation [(adimuth)] (azimuth) $\Phi$ between the grid G on the wafer W and the interference fringe F of two ray beams within the plane of the wafer W can be detected through the observation of the rotation of the Moiré fringe formed between the grid on the wafer and the interference fringe. The adjustment is then made by finely moving the wafer in such a manner as to decrease the number of the Moiré fringe.

The rotation (tilt) $\Phi$ of the grid on the wafer and the interference fringe of two ray beams within the plane of incidence of the ray beams causes the same state as that produced when the pitch of the interference fringe has become large as compared with the pitch of the grid on the wafer, so that a tile adjustment can be made by decreasing the number of the Moiré fringes as in the case of the adimuth adjustment explained above. It the optic paths are arranged in symmetry, the ray of 0 order reflected by the diffraction grid G returns to the ray source so that the tilt adjustment of the wafer can be conducted also by detecting the change of position of the reflected ray attributable to the shifting of the wafer.

After making the [adimuth] *azimuth* and tilt adjustments as described, the alignment of the patterns in the reticle and the wafer is conducted in accordance with the principle as represented by the equation (1) and (2) mentioned before.

FIG. 14 shows a second embodiment of the invention in which the grid G formed on the wafer W has a pattern composed of a stripe-shaped grid pattern and a conventional crusiform-shaped mark M formed by removing parts of the stripe-shaped pattern. With this arrangement, it is period of time.

Figure 16A:
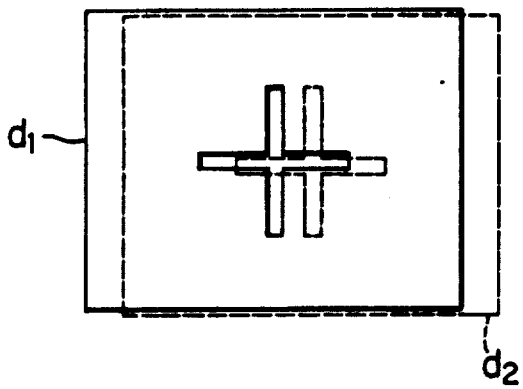
FIGS. 16a and 16b are illustrations of an aligning method in accordance with the invention.
Figure 16B:
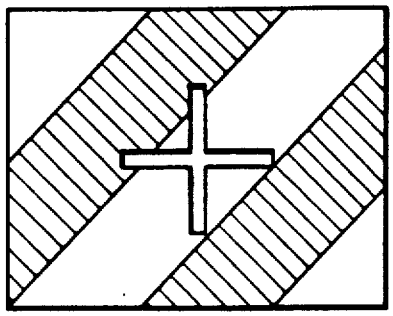

The diffracted ray from the grid pattern on the wafer W shown in FIG. 14 forms an image which is composed of a bright rectangular pattern and a dark crusiform-shaped pattern in the bright pattern, as will be seen from FIG. 16a. The diffracted ray beam of one incident ray beam 112 forms an image of a pattern $d_1$, while the diffracted ray beam of the other incident ray beam 113 corresponds to the image of the pattern $d_2$. When viewed from the same side as the photodetecting means, the crusiform-shaped dark pattern is doubled if the alignment has been made imperfectly. By providing a photodetecting means corresponding to the cross-shaped pattern and effecting the adjustment of relative position between the wafer and the reticle such that the crusiform-shaped patterns images is superposed together, it is possible to effect the alignment of the patterns by the same method as the conventional method. Namely, the embodiment permits an approximate alignment on the order of 0.3 micron which has been accomplished by the conventional aligning method. When this alignment has been accomplished, Moiré fringe comes to appear in the rectangular bright pattern as shown in FIG. 16b. It is possible to attain a highly accurate alignment in a short period of time, by the aligning method of the invention making use of the Moiré fringe.

Figure 17:
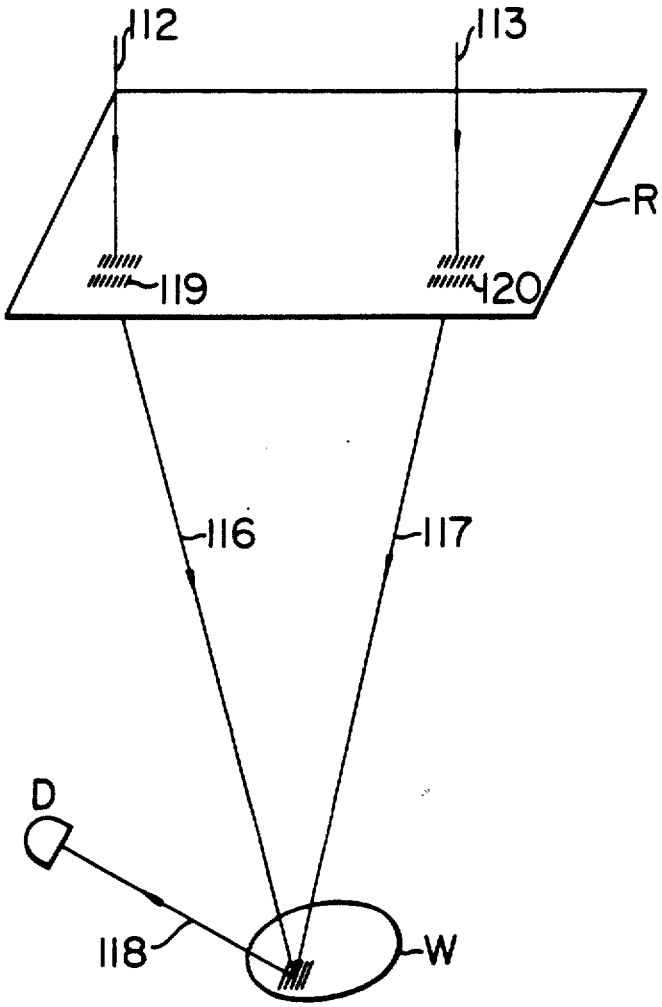
FIG. 17 shows an arrangement for carrying out another embodiment of the aligning method of the invention.
Figure 18A:
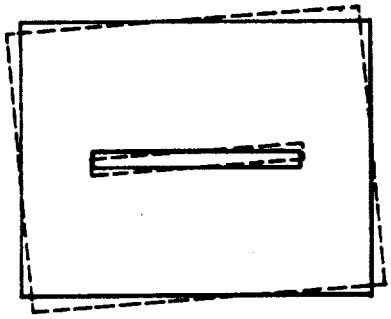
FIGS. 18a and 18b are illustrations of the aligning method as explained in connection with FIG. 17.
Figure 18B:
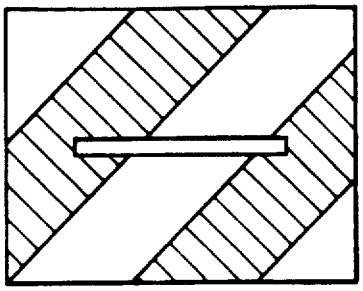

FIG. 17 shows a third embodiment which differs from the second embodiment in that the grid patterns 119, 120 on the reticle R include figure patterns of periods different from those of the grid patterns, e.g. linear patterns. Due to the use of the figure patterns, offset of the diffracted rays 118 takes place as shown in FIG. 18a if the alignment has been made imperfectly. In this case, therefore, an approximate alignment on the order of 0.3 μm can be achieved as in the case of the conventional aligning method, by a method similar to the method which has been explained already in connection with FIGS. 16a and 16b. In this case, however, since figure patterns are formed in the grids 119, 120 on the reticle R, it is possible to move the reticle R into alignment with the wafer W while fixing the wafer W. After completion of this approximate alignment, a fine alignment is conducted in accordance with the aligning method of the invention in the manner explained before in connection with FIG. 16b, using the Moiré fringes as shown in FIG. 18b.

Figure 19:
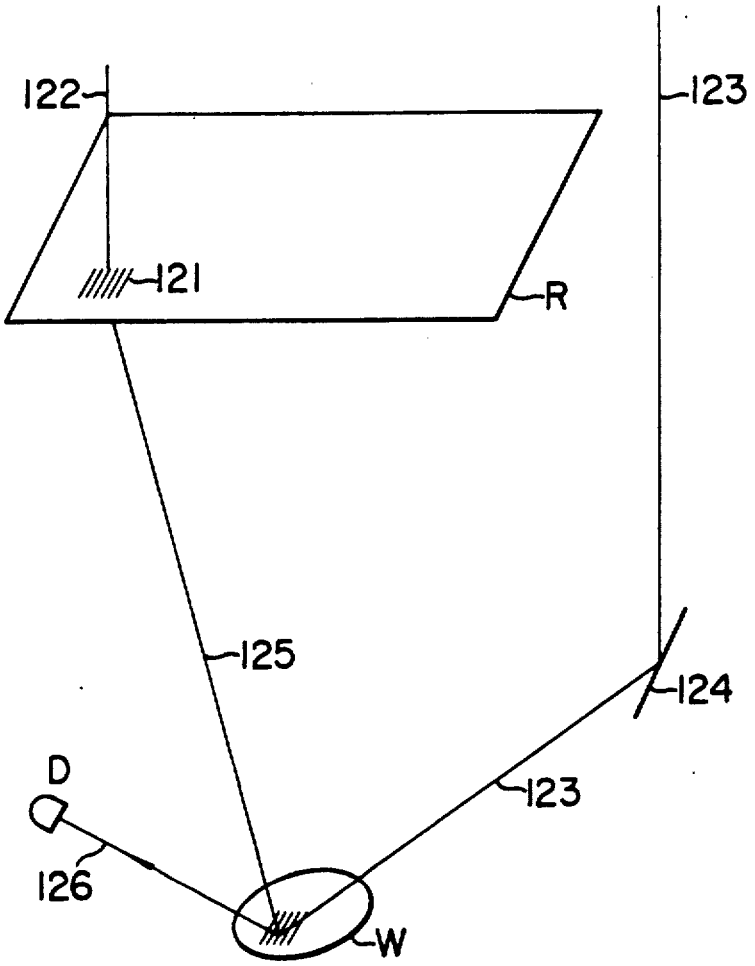
FIG. 19 is a schematic illustration of arrangement for carrying out still another embodiment of the aligning method of the invention.

FIG. 19 shows still another embodiment of the aligning method in accordance with the invention. This embodiment differs from the embodiments shown in FIGS 12 and 15 in the following point. Namely, in the embodiments shown in FIGS. 12 and 15, two diffraction grids are provided on the reticle and coherent rays are applied to these grids to permit the information concerning the position of the reticle to be exposed in terms of diffraction angle. In contrast, in the embodiment shown in FIG. 19, the reticle R has only one diffraction grid 121 to which a coherent ray 121 is applied to permit the information concerning the reticle position by means of diffraction angle, and the diffracted ray 125 is applied to the wafer W. A reference ray beam 123 which can interfere with the ray beam 122 is reflected by a mirror 124 and is applied to the wafer W on which it is made to interfere with the diffracted ray 125 to form interference fringe which carries the information concerning position. The ray 126 reflected by the wafer W is applied to the photodetector. Therefore, at the position of the photodetector D which receives the reflected ray 126 from the wafer W, it is possible to effect the coarse and independent alignment of the wafer W by applying only the reference ray 123 to the grid. Then, by applying the ray 125 diffracted by the grid on the reticle R to the wafer, it is possible to attain an alignment with a high degree of accuracy equivalent to that performed by the method explained in connection with FIGS. 12 and 15.

Figure 20:
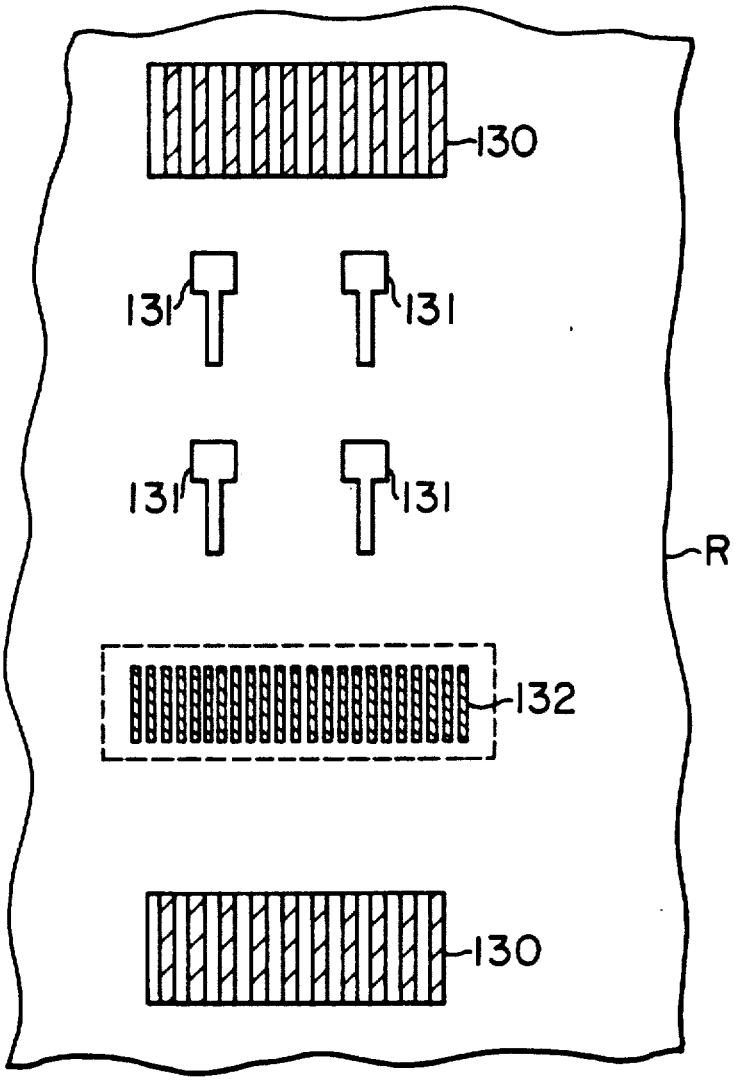
FIG. 20 is a plan view of a pattern on a reticle.

FIG. 20 shows a further embodiment of the invention which differs from the embodiment shown in FIG. 13 in that the pitch of the grid on the wafer is selected to be n (n being an integer) times as large as the pitch of the interference fringe, so that the alignment can be achieved with a high degree of accuracy even with the use of an aligning mark which is obtained by the conventional exposure method.

Figure 21A:
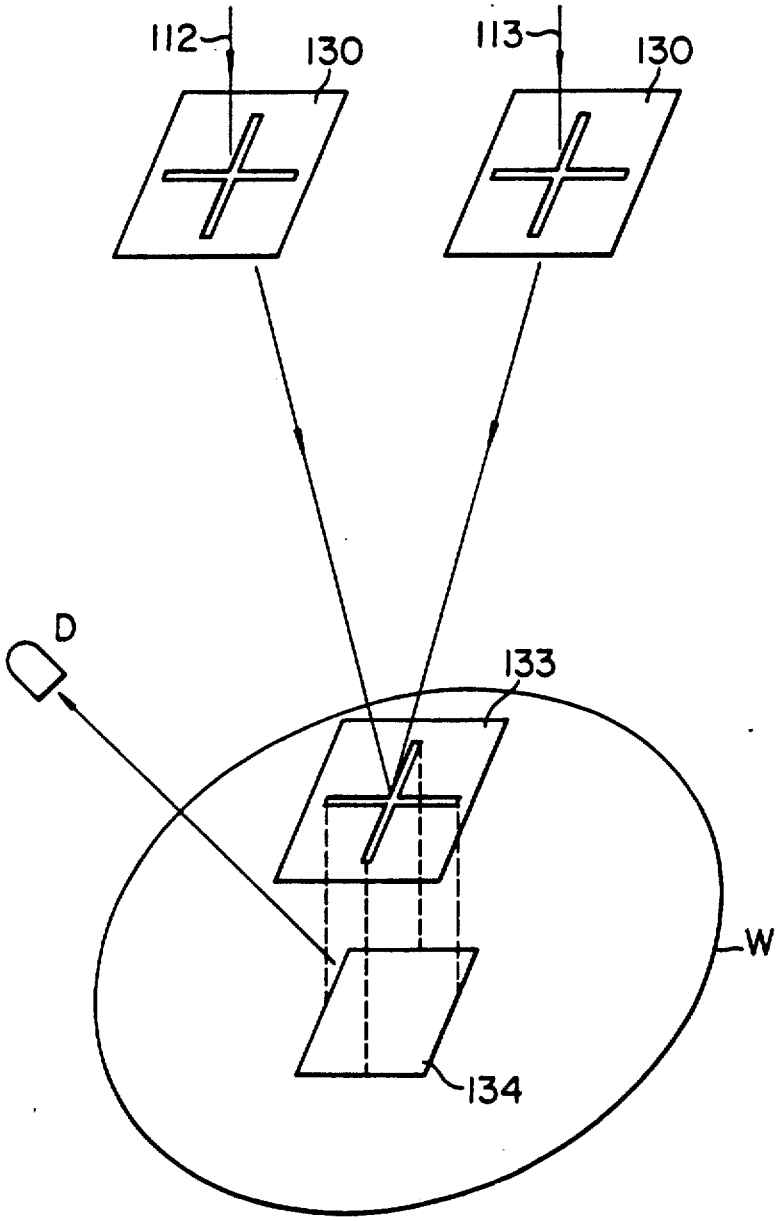
FIG. 21a is an illustration of a further embodiment of the aligning method of the invention.
Figure 21B:
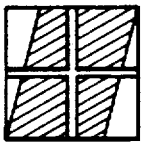
FIG. 21b is a plan view of a diffraction image.
Figure 22:
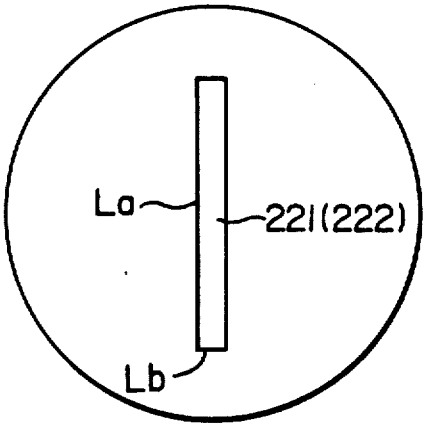
FIG. 22 is an enlarged plan view of an example of slit used in the aligning method of the invention.

A diffraction grid 130 formed in, for example, the scribe line of the reticle R and the gate pattern 131 of a MOS transistor as a circuit element are disposed on the reticle R with a high degree of accuracy. The diffraction grid 130 includes a crusiform-shaped aligning mark (not shown in FIG. 20) as shown, for example, in FIG. 21a. A reference numeral 132 appearing in FIG. 20 designates a interference fringe formed on the wafer. As in the case of the arrangement shown in FIG. 17, laser beams 112 and 113 impinge upon the grid 130 to permit the alignment such that the aligning pattern on the reticle is aligned. The pattern (a projected image of the grid 130) is designated at numeral 133 in FIG. 21a. To this pattern 133, the grid 134 on the wafer W is superposed as the aligning pattern for alignment with the crusiform mark. Since this grid 134 is formed on the wafer W by the conventional ray exposure, it is not possible to obtain the thin pattern of the line width comparing with the line width of the interference fringe as obtained through the interference fringe exposure attained by the laser holography in accordance with the invention. Therefore, if the pitch of the grid 134 on the wafer W is selected to be n(n being an integer) times as large as the pitch of the interference fringe 132, a diffraction image of the pattern consisting of the crusiform-shape and the aligning pattern 134 on the wafer superposed to each other is obtained as the position of the photodetector D, as shown in FIG. 21b. It is possible to effect a highly accurate alignment by making use of the Moiré fringe of this diffraction image.

The wavelength of the laser beam for alignment is preferably selected so as not to affect the resist formed on the wafer. The alignment and the exposure will be facilitated if the alignment is conducted with, for example, red ray, while effecting the exposure by ultraviolet rays as in the case of the conventional exposure.

In the aligning method of the invention, a higher sensitivity for alignment can be achieved by adding a slit to the portion of the optic path ahead of the photodetector.

Figure 23:
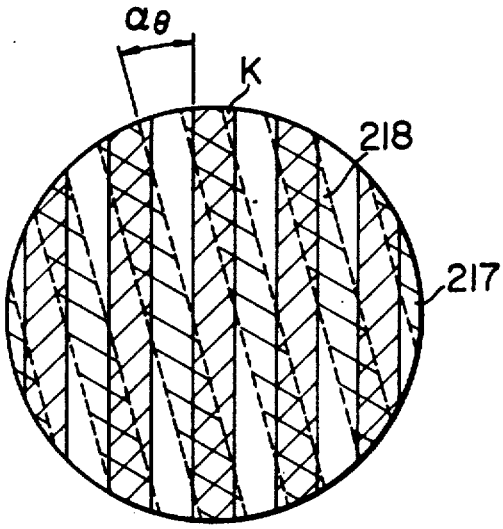
FIGS. 23 and 24 are plan views showing the relationship between the interference fringes of two ray beams and a grid before the alignment.
Figure 24:
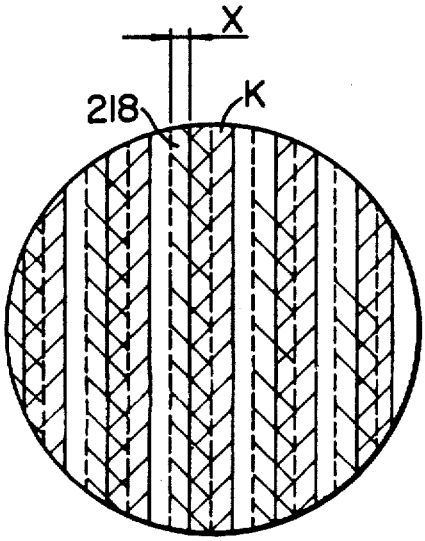

FIGS. 23 and 24 show positional relationship between the interference fringe of two ray beams and the grid 218 before the alignment. In these Figures, K represents the interference fringe, $\alpha_\theta$ represents the angle formed between the interference fringe K and the grid 218 and x represents the deviation of pitch between the interference fringe K and the grid 218.

Figure 25:
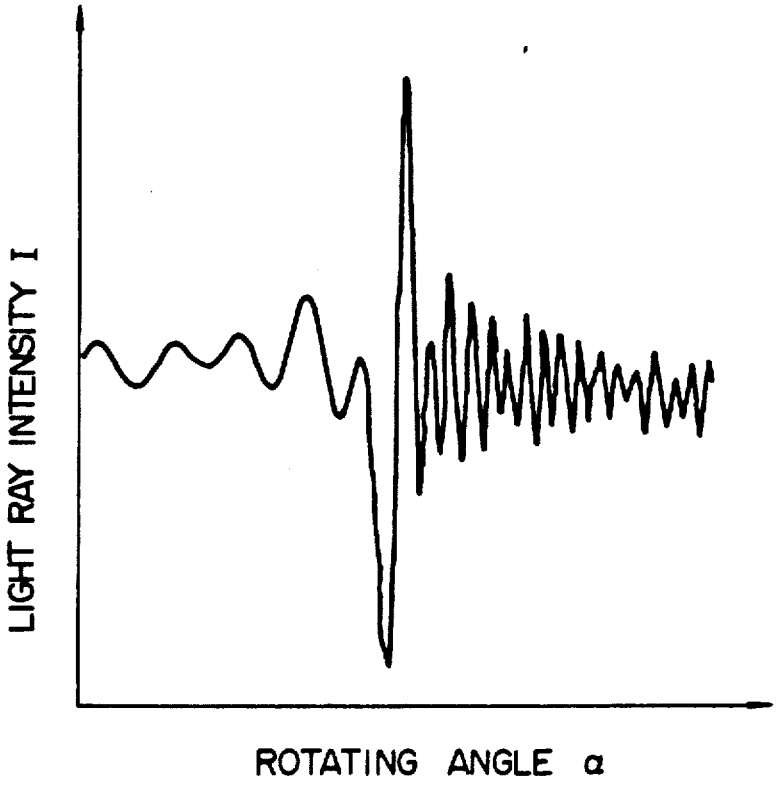
FIG. 25 is a graph showing how the ray intensity is affected by the rotational angular deviation between the interference fringe and a grid as observed when a slit is disposed with its longer side extended substantially in parallel the interference fringes.
Figure 26:
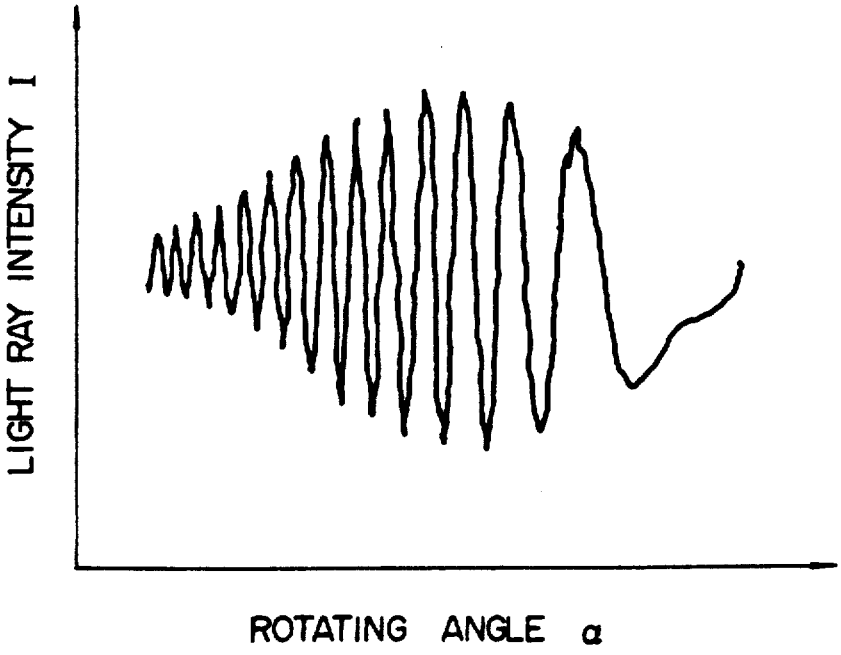
FIG. 26 is a graph showing how the ray intensity is affected by the rotational angular deviation between the interference fringes of two ray beams and a grid as observed when a slit is disposed with its longer side extending substantially perpendicularly to the interference fringe.

A change of ray intensity I as shown in FIG. 25 is obtained as the wafer 217 is rotated by a slight angle around a line normal to the plane containing the grid 218, while leading the ray beams to the photodetectors $D_1$ and $D_2$ through slits 221 and 222. More specifically, in FIG. 25, the axis of ordinate represents the ray intensity I, while the axis of abscissa represents the amount a of rotation. The level of the peak value of the ray intensity varies depending on the shapes of the slits 221 and 222. More specifically, FIG. 25 shows the change in the ray intensity I as observed when the slits 221 and 222 are arranged such that their longitudinal sides $L_a$ are extended substantially in parallel with the interference fringe, while FIG. 26 shows the change of the ray intensity I as observed when the slits are disposed such that their longitudinal sides $L_a$ extend substantially perpendicularly to the interference fringe. A symbol $L_b$ shows the breadthwise direction of the slit. As will be seen from FIGS. 25 and 26, it will be seen that the a higher sensitivity of the ray intensity information to the rotation is obtained by arranging the slits 221, 222 with their longer sides $L_a$ substantially parallel to two ray beams. Namely, in this embodiment of the invention, the change in the ray intensity becomes greater as the angle $\alpha_\theta$ formed between the grid 218 and the interference fringe of two ray beams approaches zero. This change in the ray intensity appears in the direction parallel to the interference fringe K. That is, the ray intensity change becomes more distinguishable as the length of the longer sides $L_a$ becomes greater under the condition of the length of the longer sides $L_a$ greater than the length of the breadthwise side $L_b$.

When the ray intensity takes its peak value, the angle $\alpha_\theta$ formed between the interference fringe K and the grid 218 becomes zero. In other words, the interference fringe K and the grid 218 become parallel to each other.

Figure 28:
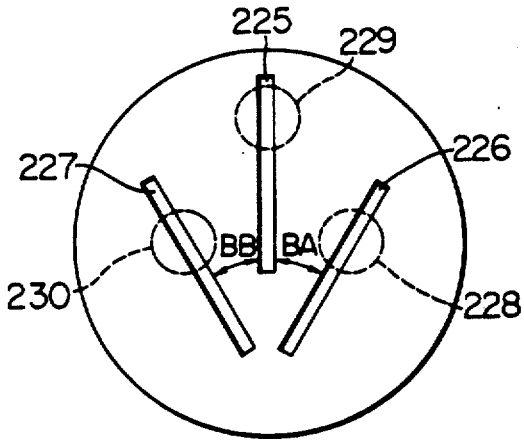
FIG. 28 is a plan view showing another example of the slit as used in the aligning method of the invention.

FIG. 28 shows a modification in which three slits are used: namely, a slit 225 parallel to the interference fringe of two ray beams, a slit 226 inclined at a predetermined angle BA with respect to the slit 225, and a slit 227 which is inclined at a predetermined angle BB to the slit 225. In this case, photodetectors 228, 229 and 230 are disposed at positions corresponding to respective slits. By comparing the outputs from these three photodetectors, it is possible to detect the direction of rotation for reducing the angle $\alpha_\theta$ between the interference fringe K and the grid 218 to 0 (zero).

Although in the described embodiment the alignment is achieved by rotating the wafer 27, it is possible to obtain the same effect by rotating two ray beams instead of rotating the wafer 217.

Figure 27:
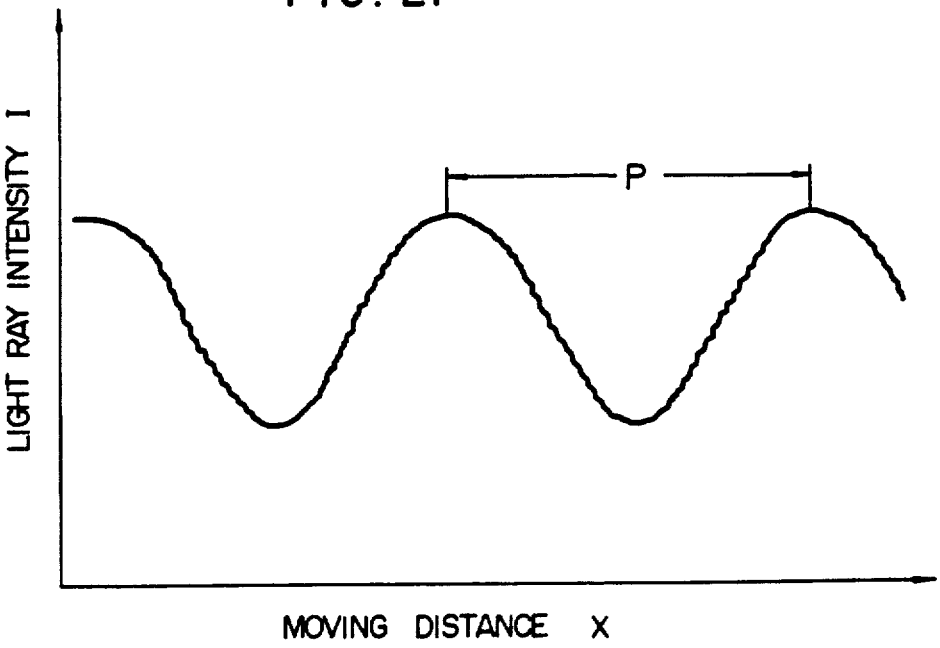
FIG. 27 is a graph showing how the ray intensity is affected by the deviation in the pitch direction as observed in the aligning method of the invention.

FIG. 27 shows the change of the ray intensity I as observed when the wafer 217 is slightly moved in the direction of the pitch of the interference fringe formed by the interference between two ray beams. In this embodiment, the axis of ordinate represents the ray intensity I, while the axis of ordinate shows the amount x of movement. It will be understood that the ray intensity I is periodically changed at the same pitch as the pitch P of the grid. The small fluctuations of the ray intensity I are attributable to the feed at a fine pitch. When the ray intensity I takes the peak value, the shift x in pitch between the interference fringe K and the grid 218 becomes zero.

In this embodiment, the alignment is achieved by moving the wafer 217. An equivalent effect, however, can be obtained by moving two ray beams instead of the wafer 217. It does not matter that either the alignment in the rotational direction or the alignment in the direction x of pitch is made first. The alignment in two directions is accomplished when the ray intensity I takes the peak value, and the aligning accuracy is enhanced as the ray intensity I approaches the peak value.

Figure 29:
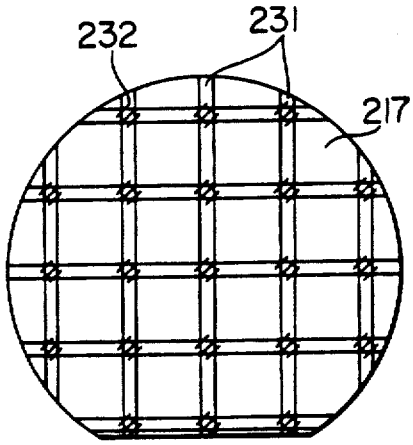
FIG. 29a is an illustration of alignment between a photo mask and a wafer for a proximity exposure, as well as the exposure process.

FIG. 29 shows a different embodiment in which a grid 232 is positioned at the point of intersection of the scribe lines 231 of the wafer, at 45° inclination to the scribe line 231. According to this arrangement, it is possible to avoid the formation of diffraction image of each pattern provided on the wafer 217 and, hence, to achieve the alignment with a high degree of accuracy.

Figure 29A:
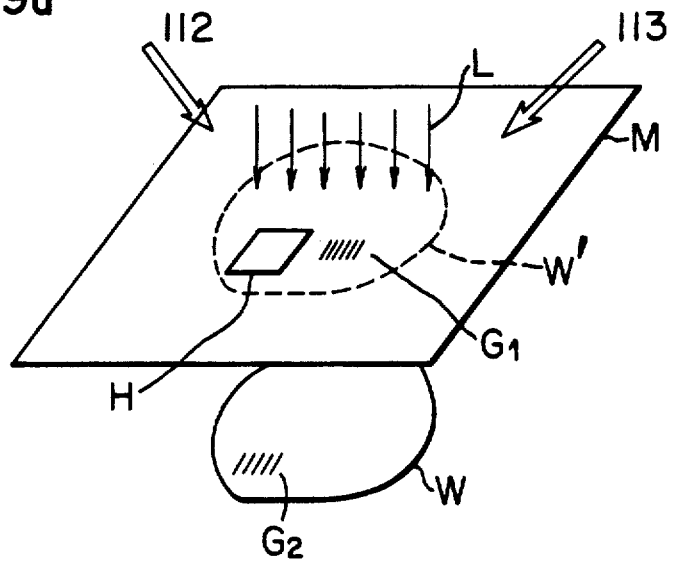

A description will be made hereinunder as to an embodiment in which the alignment is achieved between the interference fringe of two ray beams and a grid for a subsequent proximity exposure as is the case of the X-ray exposure. A photo mask M and a wafer W are arranged in close proximity with each other as shown in FIG. 29a. An alignment is effected between the interference fringe of two ray beams and the aligning grid $G_1$ on the photo mask as has been described already. The photo mask is further provided with a transparent aligning window H so that the alignment of the wafer W for the proximity exposure is conducted through this window. An aligning grid G2 for alignment is provided on the wafer W, and the positions of the grids $G_1$ and $G_2$ can be determined accurately at every one pitch of the interference fringe.

Figure 30:
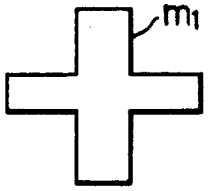
FIG. 30 is a plan view of an aligning mark on a photo mask.
Figure 31:
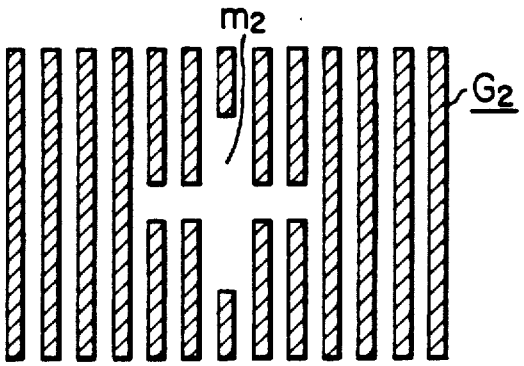
FIG. 31 is a plan view of an aligning mark formed in the grid of a wafer.
Figure 32A:
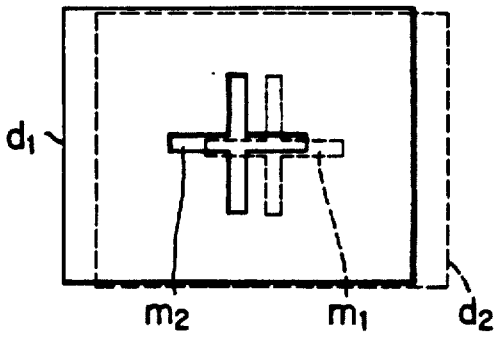
FIGS. 32a and 32b are illustrations of alignment between an aligning mark on a photo mask and a grid aligning mark on a wafer.
Figure 32B:
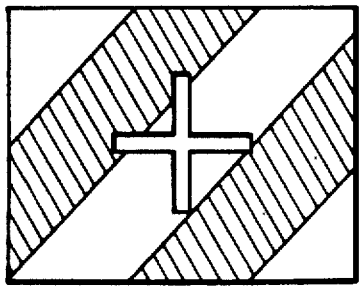

Assume here that a conventionally used aligning mark such as a crusiform-shaped mark as shown in FIG. 30 is formed in the window H of the photo mask M, while a crusiform-shaped mark is formed in the grid $G_2$ on the wafer as shown in FIG. 31. Then, an alignment is made to approximately align the crusiform-shaped mark shown in FIG. 30 and the crusiform-shaped mark shown in FIG. 31. In FIG. 32a, a reference symbol $d_1$ denotes a pattern formed on the wafer W, while $d_2$ represents a pattern on the mask. An aligning operation is conducted to make $m_1$ and $m_2$ align with each other. Then, a fine alignment is accomplished by aligning operation making use of the interference fringe of two ray beams as shown in FIG. 32b. Thus, the alignment of the photo mask is conducted once when the photo mask is set and the transfer is made repeatedly on wafers using this photo mask. After the completion of alignment, exposure is conducted by proximity exposure method making use of X-ray, ion beams and ultra-violet rays.

Major optic systems for carrying out the aligning method and exposure method of the invention have been described. An explanation will be made hereinunder as to a holographic exposure system as a practical example of such optic systems.

Figure 33:
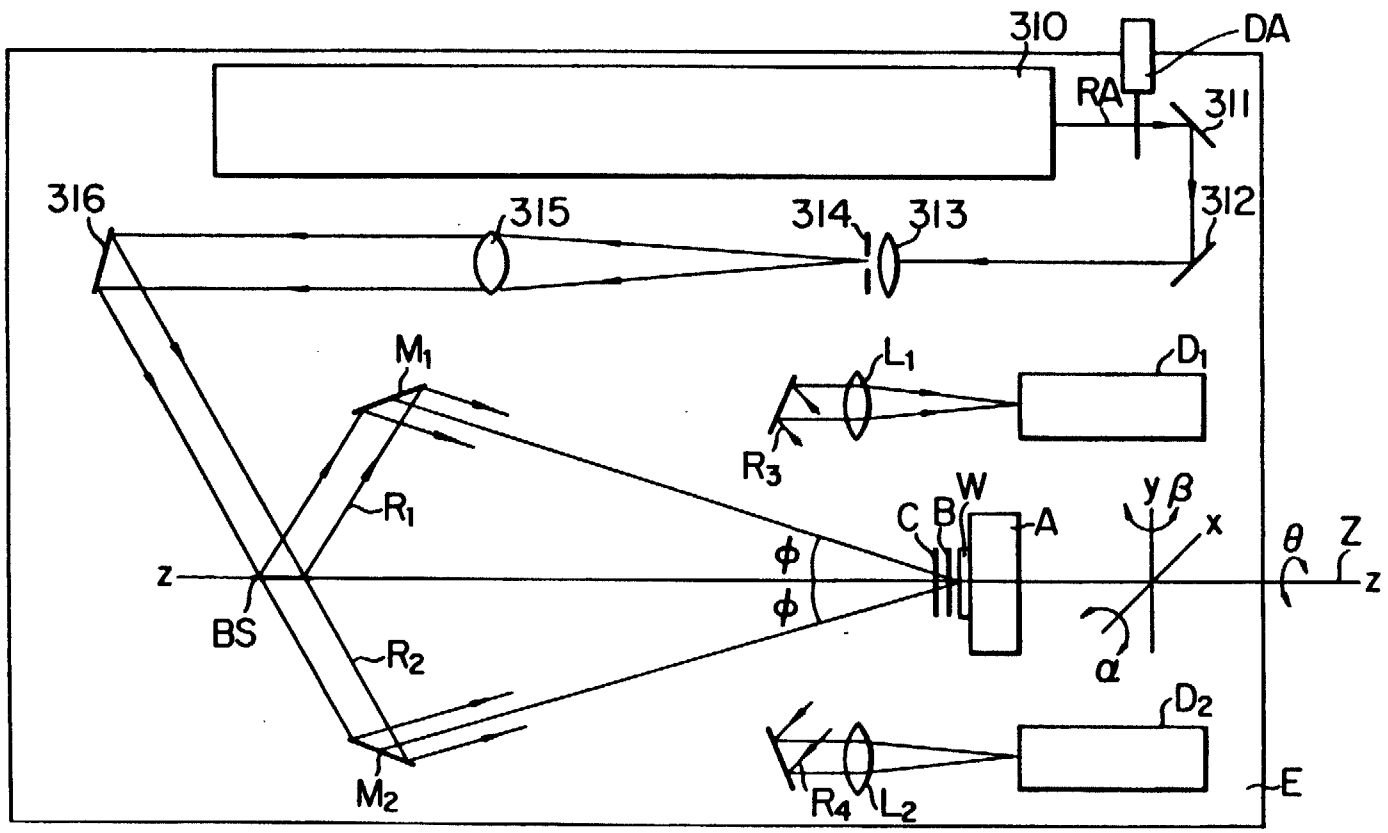
FIG. 33 shows the general arrangement of the exposure system for carrying out an embodiment of the exposure method of the invention.

FIG. 33 shows the general arrangement of the exposure system embodying the present invention. In operation, a coherent ray RA is emitted from a laser source 310, and is introduced to a lens 313 through reflecting mirrors 311, 312, and is diversified by a pin hole 314 and changed into parallel ray beam through a collimating lens 315. The parallel ray beam is then applied to a beam splitter BS and is amplitude-splitted into reflected ray $R_1$ and transmitted ray $R_2$ of a substantially equal intensity.

The amplitude-splitted reflected ray $R_1$ and the transmitted ray $R_2$ impinge upon the reflecting mirrors $M_1$ and $M_2$, respectively, and are applied to the surface of a specimen W. These constituents BS, $M_1$, $M_2$ and W are so arranged that the rays reflected by the mirrors $M_1$ and $M_2$ impinge upon the surface of the specimen at an equal incidence angle $\theta$.

Figure 34:
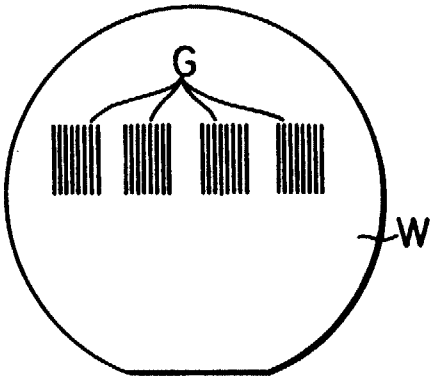
FIG. 34 is a plan view of a specimen W having a grid G used in the exposure system shown in FIG. 33.

As shown in FIG. 34, grids G are formed in a plurality of [block] *blocks* on the specimen W. The reflected rays $R_3$ and $R_4$ diffracted by the grid G impinge upon the photodetectors $D_1$ and $D_2$ through the optic systems including lenses $L_1$ and $L_2$.

Representing the wavelength of the laser beam by $\lambda$ and the pitch of the interference fringe formed by interference of the reflected rays $R_1$ and $R_2$ from the mirrors $M_1$ and $M_2$ by $\Lambda$ the pitch of the interference fringe formed on the specimen W is expressed by the following formula.

$$\Lambda = \frac{\lambda}{2 \sin \phi}$$

The grid G having a pitch substantially equal to the pitch $\lambda$ of the interference fringe produces rays which are obtained through a diffraction of the ray formed by the interference between two ray beams $R_1$ and $R_2$, the diffraction being made by the grid which effects a wave-surface splitting of the ray beam formed by the interference. The rays produced by the wave-surface splitting are converged through the optic systems of the lenses $L_1$ and $L_2$ and are made to interfere with each other. By so doing, it is possible to obtain by photodetectors $D_1$ and $D_2$ a ray intensity which represents the positional relationship between the interference fringe formed by two ray beams and the grid G.

By making use of this ray intensity representing the positional relationship, it is possible to detect the positional relationship between the specimen W and the interference fringe of two ray beams and to correct the position of the specimen W, thereby to attain alignment between the interference fringe of two ray beams and the specimen W.

A z axis is assumed here as being the central axis z—z of optic paths of the reflected ray beam $R_1$ and the transmitted ray $R_2$. The specimen W is held by a fine adjusting mechanism A which can hold the specimen W such that its surface carrying the grid G is substantially perpendicular to the z axis and has functions to effect fine adjustment of position in the x and z axes, as well as in the rotational directions around the axes x, y and z, the rotational angles being represented by $\alpha$, $\beta$ and $\theta$. The positional relationship between the interference fringe and the grid G on the specimen W is adjusted by means of the fine adjusting mechanism A.

Figure 35:
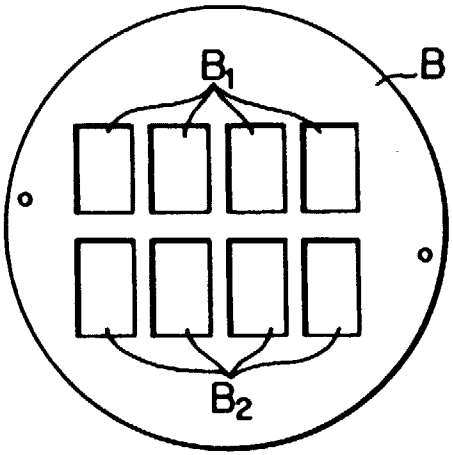
FIG. 35 is a plan view of a mask B used in the exposure system, having a plurality of windows B1 and B2.

A symbol B represents a mask having a form as shown in FIG. 35. The mask B is provided with a plurality of windows $B_1$ at the portion thereof corresponding to the position of the grid G so as to pass two ray beams, and at its portion with a plurality of windows $B_2$ at its portion corresponding to the exposure position of the specimen W.

A symbol C denotes an optic path partial intercepter having an intercepting mechanism which is adapted to partially intercept two ray beams such that two ray beams are applied only to the grid portion G when the positional relationship between the aforementioned interference fringe and the specimen W is adjusted, and to intercept two ray beams partially such that the ray beams impinge only upon the specimen W when the exposure is conducted after the alignment.

A symbol DA represents an optic path full intercepter disposed between the laser generator 310 and the reflecting mirror 311 and having an intercepting mechanism adapted to fully intercept the optic path.

The constituents 310, 311, 312, 313, 314, 315, 316, BS, $M_1$, $M_2$ and A are mounted on the same vibration damping base so that they are protected from external vibration. The optic path intercepters C and DA are mounted on a base (not shown) different from the vibration damping base E so that the vibration produced as a result of operation thereof is not transmitted to the vibration damping base E.

Figure 36:
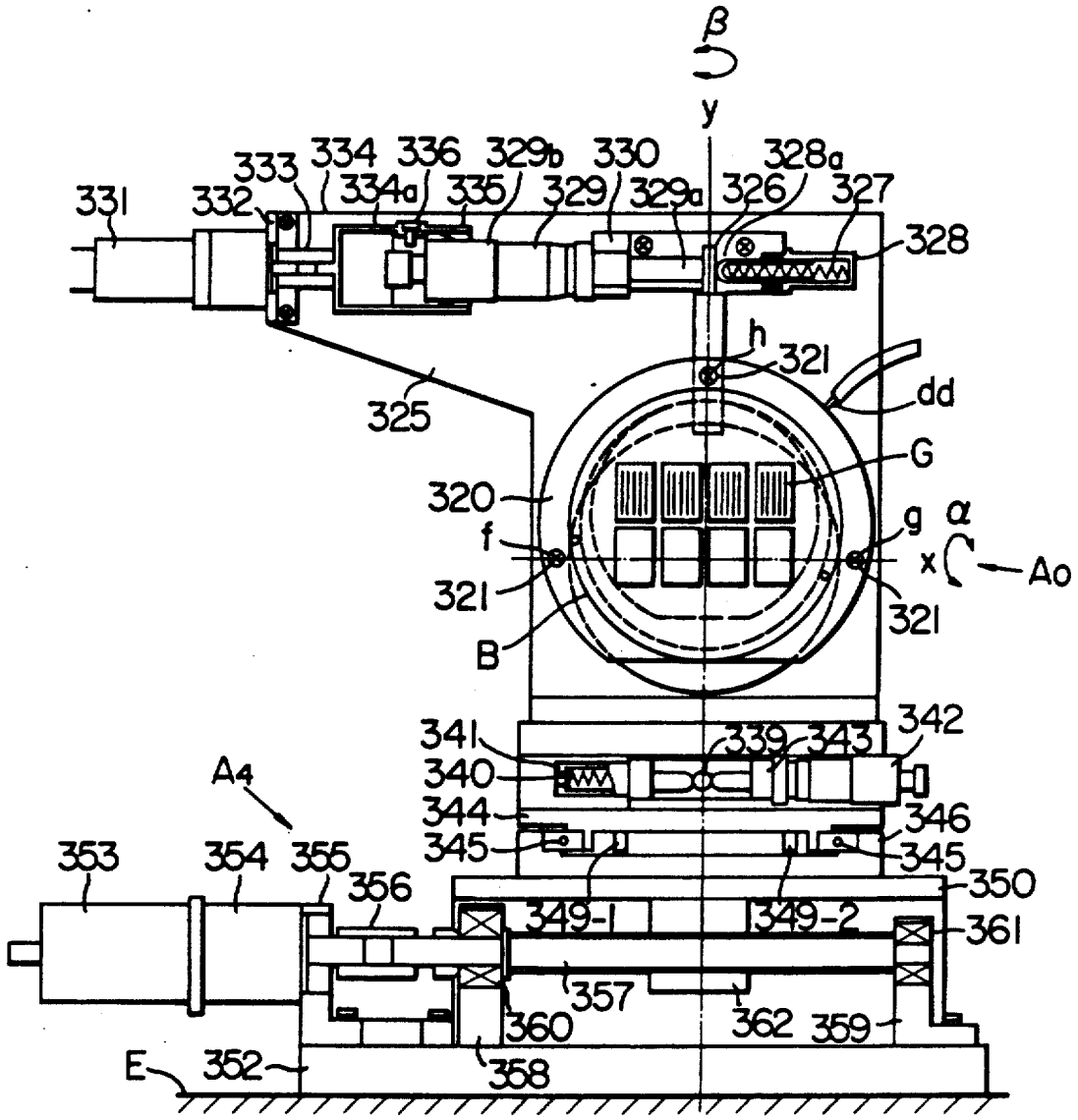
FIG. 36 is a partly-sectioned view of a fine adjustment mechanism A of the exposure system as viewed in the direction of the optic axis z.
Figure 37:
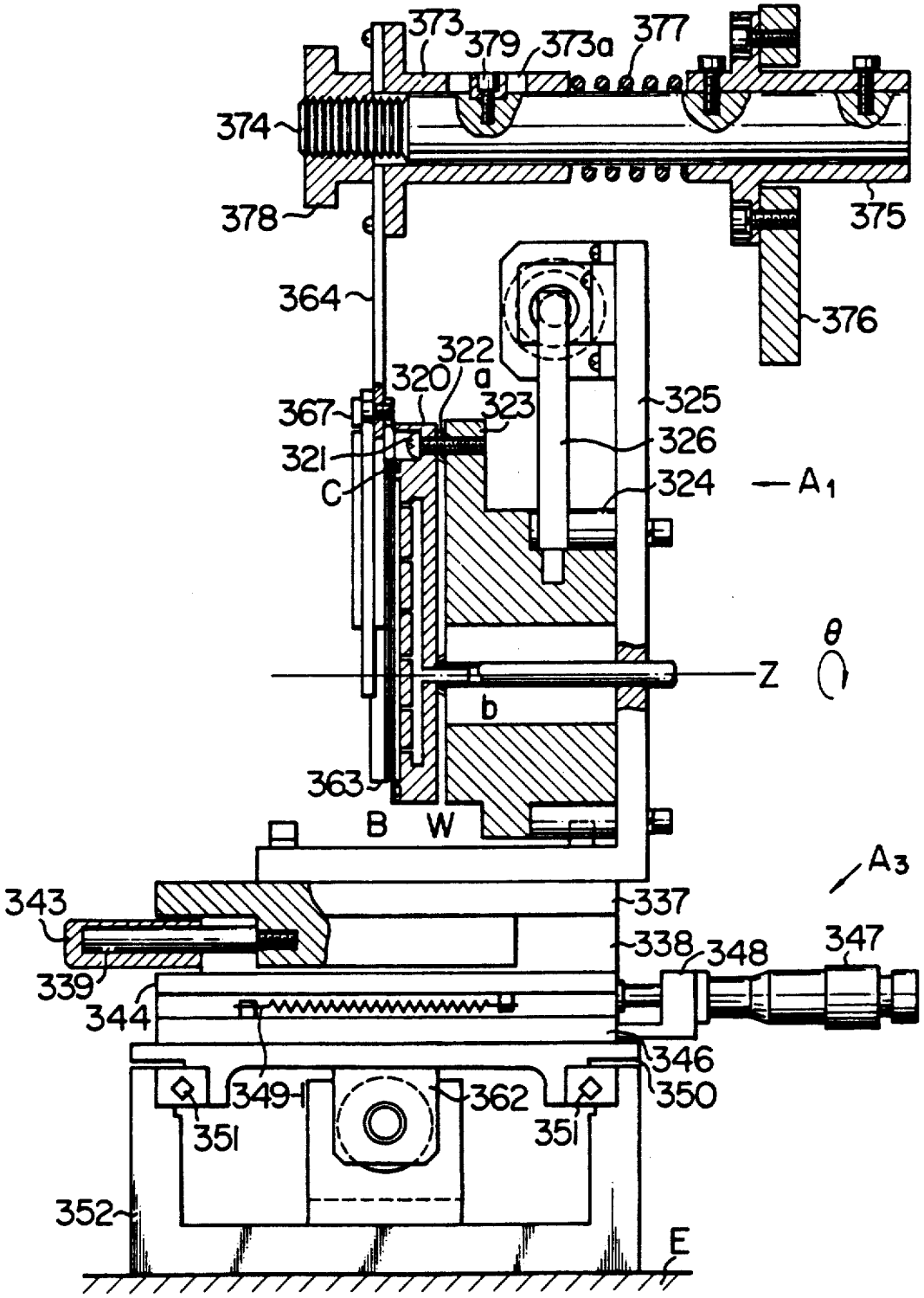
FIG. 37 is a sectional view of the fine adjustment mechanism A and a ray-path partial intercepter taken along a z-y plane.

The detail of the fine adjustment mechanism A will be described hereinunder with specific reference to FIGS. 36 and 37.

A reference numeral 320 designates a specimen holder having a vacuum sucking hole a for sucking and holding the specimen W having the grid G and a vacuum hole b. The vacuum hole b is connected to a vacuum source which is not shown. The specimen base 320 is provided also with a vacuum sucking groove c for sucking and fixing the mask B and a vacuum port dd which is connected to a vacuum source (not shown). The height of the step between the surface portion of the specimen holder for sucking the specimen W and the surface portion of the same for sucking the mask B is selected to be slightly greater than the thickness t of the specimen W.

An explanation will be made hereinunder as to the adjusting mechanism $A_0$ for adjusting the angle $\alpha$. The specimen holder 320 is fixed through a belleville spring 322 to a $\theta$ rotation mechanism $A_1$ by means of three bolts 321. In order to permit the specimen W to rotate around the x axis by a small angle $\alpha$, bolts 321 are adapted to be fixed at both ends f and g or the x axis and on one end h on the y axis.

An explanation will be made hereinunder as to the $\theta$ rotation mechanism $A_1$. A reference numeral 323 designates a rocker plate connected to the specimen base 320 through the belleville spring 322 by means of bolts 321. The rocker plate 323 is rotatably held by a rotary guide ring 324 so as to be able to rotate smoothly around the z axis. A reference numeral 325 denotes a $\theta$ rotation mechanism base for fixing the rotary guide ring 324, while a reference numeral 326 denotes an arm which is fixed at its one end to the rocker plate 323. The other end of the arm 326 is pressed by a pressurizing unit 328 having a compressing coiled spring 327 so as to rock the rocker plate 323 in the direction of rotation. A reference numeral 329 designates a differential micrometer head contacting the arm 326 in the direction for compressing the compression coiled spring 327. The point of action 329a of the differential micrometer head 329 and the point of action 328a of the pressuring unit 328 are disposed at opposite sides of the arm 326. A reference numeral 330 designates a fixing base for fixing the differential micrometer head 329 and the pressurizing unit 328. The fixing base 330 is secured to the $\theta$ rotation mechanism base 325. A $\theta$ rotation drive motor 331 having a reduction gear is fixed to a motor mounting base 332 which in turn is fixed to the $\theta$ rotation mechanism base 325. The $\theta$ rotation drive motor 331 is connected through a coupling 333 to a rotary drum 334 so as to drive the latter. A reference numeral 335 designates a slide ring which is pressfitted into a simble 329b annexed to the differential micromotor head 329. The slide ring 335 is fitted in the rotary drum 334. A guide pin 336 is received by the elongated hole 334a in the rotary drum 334 and is fixed to the slide ring 335. As the $\theta$ rotation drive motor 331 cperates, the rotary drum 334 is rotated through the coupling 333 so that the guide pin 336, slide ring 335 and the simble 329b make spiral motion and move straight in the direction of operation of the differential micrometer head 329. As a result, the arm 326 is pushed so that the rocker plate 323 for fixing the arm 326 is guided by the rotary guide ring 324 to rotate slightly around the z axis. The slight rotation of the rocker plate 323 causes a slight rotation of the specimen holder 320 fixed to the rocker plate 323, specimen W held by the specimen holder 320 had the mask B which also is fixed to the specimen holder 320.

As the $\theta$ rotation drive motor 331 is reversed, the differential micrometer head 329 moves straight in the reverse direction. Consequently, the arm 326 is pressed by the spring force of the pressurizing unit 328 so that the rocker plate 323 is rotated around the z axis while being guided by the rotary guide ring 324. Consequently, the specimen holder 320, specimen W and the mask B are rotated slightly in the counter direction.

Consequently, by the change of the $\theta$ rotation drive motor 331, the rocker plate 323 rocks by the power of the $\theta$ rotation drive motor 331 and the spring force of the pressurizing unit 328.

The operation of the $\theta$ rotation drive motor 330 by angle $\theta_1$ causes a rotation of the rocker plate 323 by an angle $\Delta\theta$ which is given as follows.

$$\Delta\theta = \tan^{-1}\frac{\theta_1 S}{360 \times ll}$$

where, S represents the travel or feed per one rotation of the differential micrometer 329, while ll shows the distance between the axis of rocking of the rocker plate 323 and the point 329a of action of the micrometer head 329. When the travel is 50 m and ll is 100 mm, the angle $\Delta\theta$ of rotation of the rocker plate 323 is calculated to be 3" (seconds) when the angle $\theta_1$ of operation of the motor is 1°.

The $\theta$ rotation drive motor 331 operates under the control of the control section (not shown) for an $\alpha$ rotation drive motor. The $\theta$ rotary drive mechanism base 325 is fixed to a $\beta$ rotation mechanism $A_2$ which has a substantially identical construction to the $\theta$ rotation mechanism $A_1$, although it is driven not by motor but manually. A reference numeral 337 designates a $\beta$ rocker plate to which fixed is the $\theta$ rotation mechanism base 325. The $\beta$ rocker plate 337 is rotatably held by the $\beta$ rotation guide ring 338 so as to be rotated smoothly around the y axis. A reference numeral 339 designates an arm which is fixed at its one end to the $\beta$ rocker plate 337, while the other end of the same is pressed by a pressurizing unit 341 having a compression coiled spring 340 which biases the $\beta$ rocker plate 337 in the rocking direction. A differential micrometer head 342 contacts the arm 339 in the direction for compressing the compression coiled spring 340. The pressurizing unit 341 and the differential micrometer head 342 are fixed to a base 343 which in turn is fixed to the $\beta$ rotation guide ring 338. The $\beta$ rotation guide ring 338 is fixed to the z-direction drive mechanism $A_3$.

To explain in more detail about the z-direction drive mechanism $A_3$, a reference numeral 344 designates a z-axis moving member to which the $\beta$ rotation guide ring 338 is fixed. The z-axis moving member 344 is slidably held by a z-axis base 346 through two pairs of cross roller guides 345 so as to be able to slide in the direction of z axis. A differential micrometer head 347 is disposed to allow the moving member 344 to move in the direction of z axis. The differential micrometer head 347 is fixed to a base 348 which in turn in fixed to the z-axis base 346. Tension springs 349-1 and 349-2 are fixed to the moving body 344 and the z-axis base 346 so as to press the moving body 344 against the differential micrometer head 347. The z-axis moving base 346 is fixed to an x-axis drive mechanism $A_4$.

The x-axis drive mechanism $A_4$ has the following construction. A reference numeral 350 designates an x-direction moving member which is slidably carried by an x-axis base 352 through two pairs of cross roller guides 351 for sliding movement in the direction of the x axis. An x-axis drive motor 353 is fixed to a reduction gear 354 secured to a bracket 355 fixed to the x-axis base 352.

A reference numeral 356 designates a coupling through which the reduction gear 354 is connected to the ball screw 357 so that the torque of the x-axis drive motor 353 is transmitted to the ball screw 357 through the coupling 356. Numerals 358 and 359 denote brackets which accomodate ball bearings 360, 361, respectively. The brackets are fixed to the x-axis base 352. The ball screw 357 is supported by ball bearings 360, 361. A reference numeral 362 designates a nut engaging with the ball screw 357 and fixed to the x-axis moving member 350. The torque of the x-axis drive motor 353 is transmitted through the reduction gear 354 and the coupling 356 to the ball screw 357 so that the x-axis moving member 350 is moved in the direction of the x-axis through the nut 362. Operation of the x-axis drive motor 353 by an angle $\theta_2$ causes a movement $\Delta x$ of the x-axis moving member expressed by the following equation.

$$\Delta x = \frac{LL\theta_2}{360\,Q}$$

LL: lead of ball screw 357

Q reduction ratio of reduction gear 354

The amount of movement $\Delta x$ is calculated to be 0.0025 $\mu$m on the condition of LL=2 mm, Q=1/100 and $\theta_2$=0.045°.

The x-axis drive motor 353 is under the control of the x-axis drive motor control section (not shown). The x-axis base 352 is mounted on the vibration damping base E.

Figure 38:
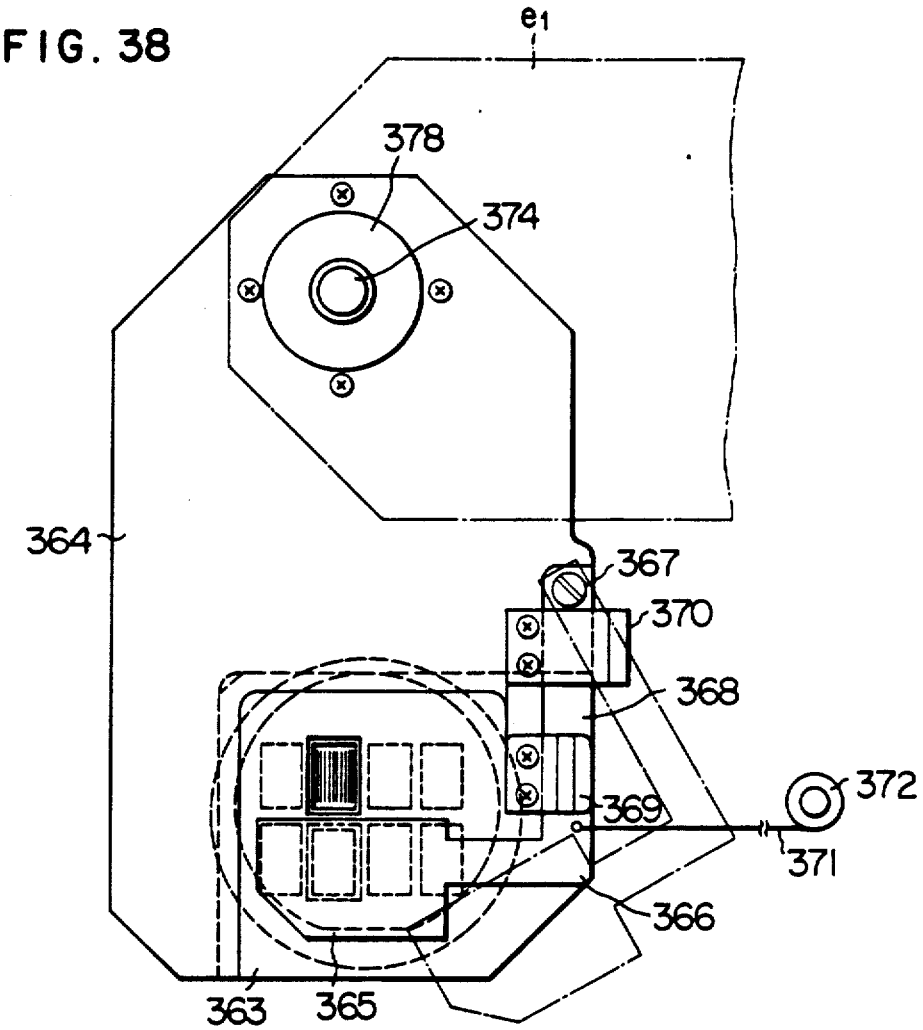
FIG. 38 is a view of the fine adjustment mechanism A of the system as viewed in the direction of the optic axis z.
Figure 39:
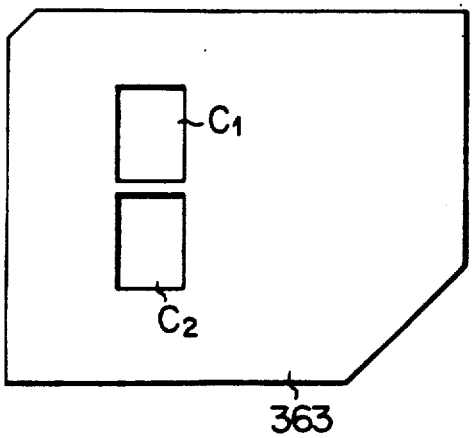
FIG. 39 is a plan view of a mask 63 incorporated in the exposure system, having windows $C_1$ and $C_2$.

An explanation will be made hereinunder as to the optic path partial intercepter C with reference to FIGS. 37 and 38. A reference numeral 363 denotes a mask having windows $C_1$, $C_2$ formed, as shown in FIG. 39, in the portions corresponding to the windows $B_1$, $B_2$ in the mask B mentioned before. The windows $C_1$ and $C_2$ have lengths and breadths which are $\Delta\delta$ greater than those of the windows $B_1$ and $B_2$. A reference numeral 364 designates a rotary plate for bonding and fixing the mask 363. while 365 designates an intercepting plate for intercepting two ray beams from the window $C_2$ in the mask 363. The intercepting plate 365 is bonded and fixed to an arm 366. A reference numeral 367 designates a fulcrum pin fixed to the rotary plate 364. The arm 366 is so mounted as to be able to rotate around the fulcrum pin 367. An arm regulating plate 368 is adapted to regulate the movement of the arm 366 such that the latter rotates along the rotary plate 364. A reference numeral 369 denotes a leaf spring which presses the arm 366 against the rotary plate 364. Another leaf spring 370 is arranged to press the arm 366 to the rotary plate when the arm 366 has been rotated to the position shown by one-dot-and-dash line. A reference numeral 371 designates a yarn retained at its one end by the arm 366 while the other end is fixed to a bobbin 372. As the yarn is wound up by the bobbin 372, the arm 366, which has been pressed by the leaf spring 369, is rotated around the fulcrum pin 368 to the position shown by one-dot-and-dash line while winding up the yarn. Then, the arm 366 is resiliently held by the leaf spring 370. Namely, during the alignment, two ray beams are intercepted by the intercepting plate 365 during aligning so that the window $C_2$ in the mask 363 is not exposed to two ray beams. For conducting the exposure after the completion of aligning operation, the arm 366 to which the intercepting plate 365 is fixed is rotated by means of the bobbin 372 so that the window $C_2$ in the mask 363 is exposed to two ray beams. After the exposure, the arm 366 is rotated manually and is resiliently pressed and held by the leaf spring 369.

A reference numeral 373 denotes a rotary ring to which the rotary plate 364 is fixed, 374 denotes a rod for guiding the rotary ring, 375 denotes a rod support for supporting the rod 374 and 375 denotes a base to which the rod support is fixed. In order to prevent vibration from being transmitted to the vibration-free base E, the base 376 is fixed to a bed (not shown) different from the vibration-free base E. A reference numeral 377 denotes a compression coiled spring disposed between the rod support 375 and the rotary ring 373 and adapted to act along the guide constituted by the rod 370. A reference numeral 378 designates a nut screwed to the threaded portion of the rod 370, while a numeral 379 designates a guide pin fixed to the rod 374 and received by a groove 373a formed in the rotary ring 373.

Figure 40:
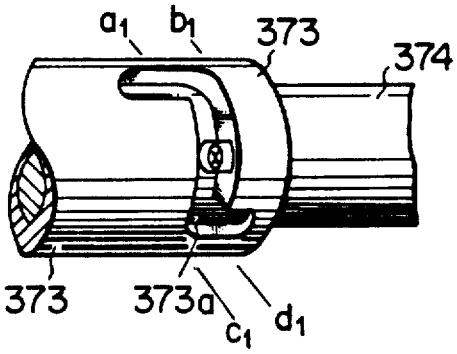
FIG. 40 is a plan view showing the detail of the groove in a rotary ring.

When the rotary ring 373 is within the range of between (a) and (b) of the groove 373a shown in FIG. 40, the rotary ring 373 is moved straight back and forth in the direction of z-axis while being guided by the guide pin 379, as the nut 378 is tightened or loosened. The straight movement of the rotary ring 373 causes a straight movement of the rotary plate 364 in the direction of the z-axis. The distance between the mask 363 and the mask B is adjusted by the straight movement of the rotary plate 364.

As the nut 378 is loosened to bring the rotary ring 373 relatively to the guide pin 379 to the position (b) in the groove 373a, the rotary ring 373 can be rotated manually around the axis of the rod 374 in the direction of the angle $\theta$ until the portion (c) of the groove 373 of the rotary ring 373 contacts the guide pin 379. Then, as the nut 378 is further loosened, when the guide pin 379 is within the region of between (c) and (d) in the groove 373a in the rotary ring 373, the rotary ring 373 moves in the direction of z-axis while being guided by the guide pin 379.

In order to mount and demount the specimen W and the mask B on and from the specimen holder 320, the nut 374 is losened to the position (b) in the groove 373a in the rotary ring 373 so that the rotary plate 364 do not hinder the mounting and demounting of the specimen W and the mask B. When the groove 373a of the rotary ring 373 is moved to the position (b), the rotary ring 373 is rotated manually until the portion (c) of the groove 373a is contacted by the guide pin 379 and, then, as the nut 373 is further loosened, the rotary plate 364 connected to the rotary ring 372 is held at the position shown by one-dot-and-dash line (e).

After the mounting of the specimen W and the mask B, the nut 378 is tightened until the position (c) in the groove 373a in the rotary ring 373 is reached, and the rotary ring 373 is rotated until the portion (b) of the groove 373a in the rotary ring 373 is contacted by the guide pin 379. Then, the nut 378 is tightened to move the rotary ring 373 straight to adjust the distance between the mask 363 and the mask B.

Figure 42:
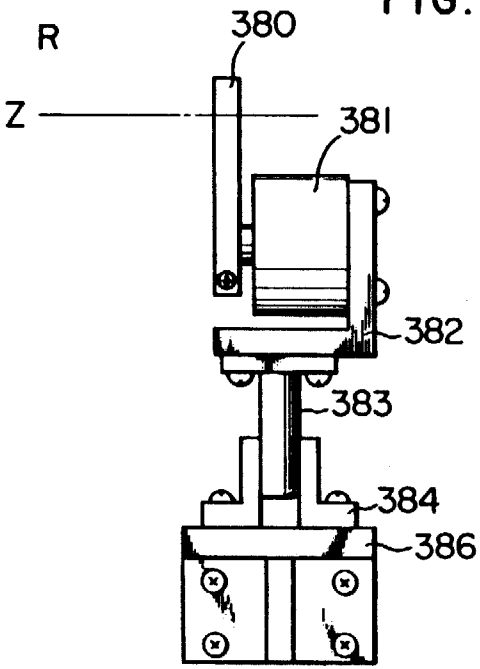
FIG. 42 is a sectional view of the ray-path whole intercepter D taken along the plane z-y.
Figure 41:
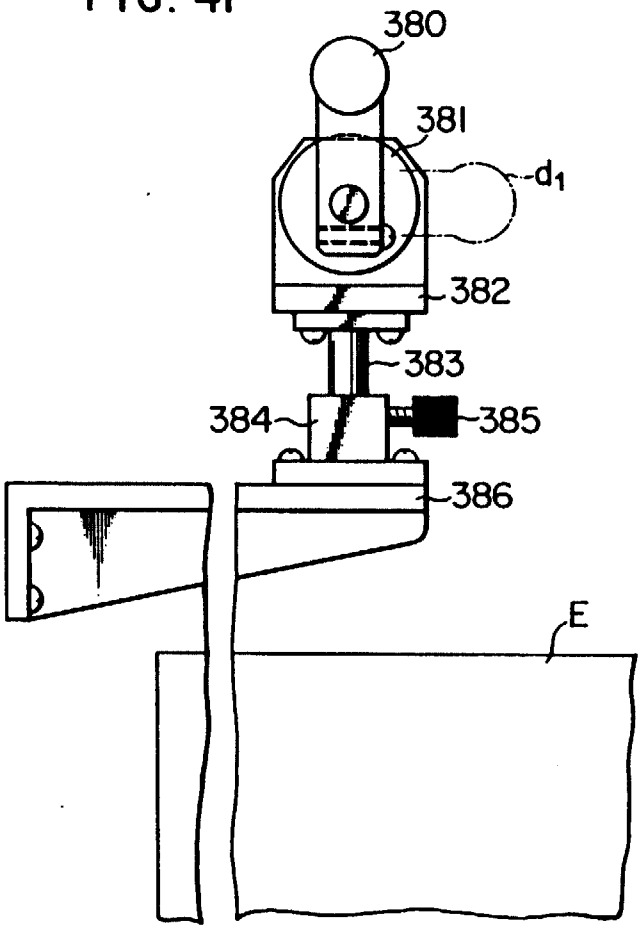
FIG. 41 is a view of a ray-path whole intercepter D as viewed in the direction of the optic axis z.

An explanation will be made hereinunder as to the optic path full intercepting mechanism DA, with specific reference to FIGS 41 and 42.

A rotary lever 380 is fixed to a rotary solenoid 381 which in turn is fixed to a fixing plate 382. A rod 383 guided by a rod support 384 is connected to the fixing plate 382. A reference numeral 385 designates an adjusting screw for effecting height adjustment of the rod 383 with respect to the optic axis. The rod support 384 is fixed to a base 386 which in turn is mounted on a base (not shown) different from the vibration-free base E. For passing the ray RA to the specimen W, the rotary solenoid 381 is operated to bring the rotary lever 380 to the position shown by one-dot-and-dash line ($f_1$).

Using the system as described hereinbefore, the exposure method of the invention is carried out in the following steps (1) to (27).

(1) The laser source 310 is started to emit a coherent ray.

(2) The ray is intercepted by the optic path full intercepter DA.

(3) The specimen W is mounted on the specimen holder 320 and is held by vacuum sucking.

(4) The mask B is mounted on the specimen holder 320 so that the window $B_1$ of the mask B is arranged to the position of the grid G on the specimen W and is held by vacuum sucking.

(5) The optic path partial intercepter C is operated to bring the window $C_1$ in the mask 363 thereof to the position corresponding to the window $B_1$ in the mask B. Namely, the nut 378 is tightened until the rotary ring 373 comes to the position ($c_1$) in the groove 373a, and the rotary ring 369 is rotated until the portion ($b_1$) of the groove 373a is contacted by the guide pin 379. Subsequently, the nut 378 is further loosened and the rotary ring 373 is further moved straight until a predetermined distance between the mask 363 and the mask B is obtained. Then, the arm 366 is rotated to bring the intercepting plate 365 to the position corresponding to the window $C_2$ in the mask 363, so as to prevent the window $C_2$ from being exposed to the two ray beams. The arm 366 is then held in this position by the leaf spring 369.

(6) To dismiss the interception of the light by the optic path fullintercepter DA to permit the ray beams to pass through.

(7) The coherent ray beam RA from the laser source 310 is applied to the beam splitter BS through the reflecting mirrors 311, 312, lens 313, pin hole 314, collimeter lens 315 and reflecting mirror 316, and is amplitudesplitted by the beam splitter BS into a reflected ray beam $R_1$ and transmitted ray beam $R_2$ which impinge upon the specimen W through the reflecting mirrors $M_1$, $M_2$ and the window $C_1$ in the mask 363 and the window $B_1$ in the mask B.

(8) The position of the specimen W is adjusted in the $\alpha$ direction and $\beta$ direction to minimize the number of the interference fringes formed by two ray beams impinging upon the specimen W. The correction of position in the $\alpha$ direction is conducted by rotating the specimen holder 320 by a small angle $\alpha$ around the x axis by the balance of tightening force of the bolt by which the specimen holder 320 is fixed to the rotary mechanism $A_1$ and the resilient force produced by the belleville spring 322. The position correction in the $\beta$ direction is conducted by operating the $\beta$ rotation mechanism $A_2$.

(9) An adjustment in the direction of z axis is conducted by the z-axis drive mechanism $A_3$ so as to make the pitch of the grid G on the specimen W equal to the pitch of the interference fringe of two ray beams.

(10) Two ray beams impinging upon the grid G are diffracted by the grid G into rays $R_3$ and $R_4$ which are applied to the photodetectors $D_1$ and $D_2$ through the optic systems including lenses $L_1$ and $L_2$, and the light intensities, as positional information concerning the relative position between the interference fringe of two ray beams and the grid G are detected.

(11) The position of the specimen W is adjusted by the rotary adjusting mechanism $A_1$ and x-axis drive mechanism $A_4$ of the fine adjusting mechanism A so as to maximize the intensity of the detected ray beams. Namely, the rotary drive mechanism $A_1$ is operated to rotate the specimen W so as to maximize the ray intensity. Subsequently, the x-axis drive mechanism $A_4$ is controlled to drive the specimen W in the direction of x axis to maximize the ray intensity. This two kinds of operation are conducted repeatedly to set the specimen W at the position where the ray intensity is maximized.

(12) The rays are intercepted again by the optic path full intercepter DA.

(13) The intercepting plate 365 and the arm 366 are rotated such that the window $C_2$ of the mask 363 in the optic path partial intercepter C is exposed to two ray beams.

(14) The interception of the rays by the optic path full intercepter DA is dismissed to permit the ray R to pass therethrough.

(15) The operation in the step (13) above permits two ray beams, i.e. the reflected beam $R_1$ and the transmitted ray beam $R_2$, to pass through the window $C_2$ in the mask 363 and the window $B_2$ in the mask B, respectively, so that these ray beams impinge upon the exposure position on the specimen W thereby to effect the exposure.

(16) After the exposure, the ray beam is intercepted again by the optic path full intercepter DA.

(17) The specimen W is moved by the x-axis drive mechanism $A_4$ to change the exposure position of the specimen W, i.e. such that the window $B_1$ of the mask B corresponds to the position which corresponds to the window $C_1$ of the mask 363.

(18) Two rays are intercepted so that the window $C_2$ of the mask 363 on the optic path partial intercepter is not exposed to two ray beams.

(19) Steps (6) to (18) are repeated.

(20) The exposure is accomplished after exposing all portions of the specimen W.

(21) Ray beams are intercepted by the optic path full intercepter DA.

(22) In order to prevent the optic path partial intercepter C from hindering the mounting and demounting of the mask B and the specimen W, the following operation is conducted. Namely, the nut 378 is loosened to the position (b) in the groove 373a in the rotary ring 373. When the rotary ring 373a had reached the position (b), it is rotated until the portion (c) of the groove 373a contacts the guide pin 379. Then, the nut 378 is further loosened so that the rotary plate 364 connected to the rotary ring 373 is held at the position shown by one-dot-and-dash line (e).

(23) Holding of the mask B by vacuum sucking is dismissed so that the mask B is mounted or demounted on or from the specimen holder 320.

(24) Holding of the specimen W by vacuum sucking is dismissed and the specimen W is mounted on or demounted from the specimen holder 320.

(25) The next specimen W is mounted.

(26) Steps (4) to (20) are repeated.

(27) The exposure process is completed as all pieces of specimen are exposed through the steps explained hereinabove.

As has been described, in the exposure system of the described embodiment, a ray beam RA emitted from a laser source 310 is made to impinge through optic systems from two directions. The specimen W having a grid G substantially parallel to the interference fringe of two ray beams is disposed in the optic paths of two ray beams. The rays reflected by the grid G are converged through the optic system and are led to photodetectors $D_1$ and $D_2$ which produce outputs representing the positional relationship between the interference fringe of two rays and the grid G. Then, the correction of position of the specimen W in the $\theta$ and x directions is conducted by operating the $\theta$ rotary mechanism $A_1$ and the x-axis drive mechanism $A_4$, thereby to permit an alignment with a sub-micron order of precision. After aligning the grid G of the specimen W and the interference fringe of two ray beams with a high degree of accuracy, the intercepting plate 363 of the optic path partial intercepter C is rotated to expose the window $C_2$ of the mask 363 to two ray beams, so that two ray beams impinge upon the portion of the specimen W to be exposed. It is, therefore, possible to form a minute pattern of sub-micron order within the atmospheric air. In addition, a larger through-put becomes obtainable because the patterns are transferred at once by means of two ray beams.

The formation of the uniform fine pattern by two ray beams with the ray intensity distribution of the ray beam produced by the laser source 310 is possible only within the range of between 20 $\Phi$ and 40 $\Phi$ mm. Due to the presence of error such as those due to distortion of the semiconductor substrate, superposing error and so forth, it is not possible to expose a large specimen at once. Therefore, as shown in FIG. 34, a plurality of blocks of grid G are formed at the portions, to be exposed, of the specimen W. With this arrangement, it is possible to expose the specimen W for each block of the grid G, by employing a mask 363 which is provided at it portion corresponding to one of the blocks with a window $C_1$ and a window $C_2$ at its portion corresponding to any one of the portions, to be exposed, of the specimen W. It is thus possible to effectively form fine patterns even on a large-size specimen W.

Since the lengths of the sizes of the windows $B_1$, $B_2$ in the mask B are smaller than those of the windows $C_1$, $C_2$ or the mask 363 of the optic path partial intercepter C, the diffraction of rays around the edges of the windows $C_1$, $C_2$ is prevented to avoid any noise which may, otherwise, be contained by the ray intensities detected by the photodetectors $D_1$ and $D_2$ and, hence, to attain an alignment with a high degree of precision.

Usually, 0.5 to 1 hour is required until the coherent ray beam from the laser source 310 is stabilized after the start up of the laser source 310. In order to prevent accidental exposure to light which may impinge at the time of, for example, mounting or demounting of the specimen W, the optic path for the ray beam directed to the specimen is selectively intercepted fully by the optic path full intercepter DA. With this arrangement, it is possible to obtain stable coherent ray beam continuously.

Furthermore, by providing the z-axis drive mechanism and the rotary $\alpha$ and $\beta$ rotation mechanisms, it is possible to obtain greater difference between the maximum value and minimum value of the ray intensity detected by the photodetectors $D_1$ and $D_2$, so that it becomes possible to obtain an alignment with a high degree of accuracy.

In order to realize the alignment as described hereinbefore, it is esential that the optic system itself is well aligned. An explanation will be made hereinunder as to an example of the apparatus for attaining this alignment.

Figure 43:
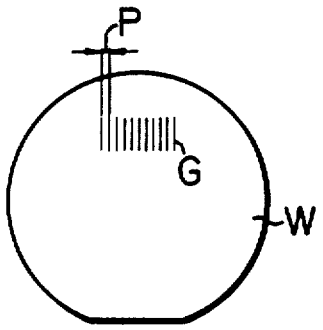
FIG. 43 is a plan view of a specimen having a diffraction grid G used in the exposure system.
Figure 44:
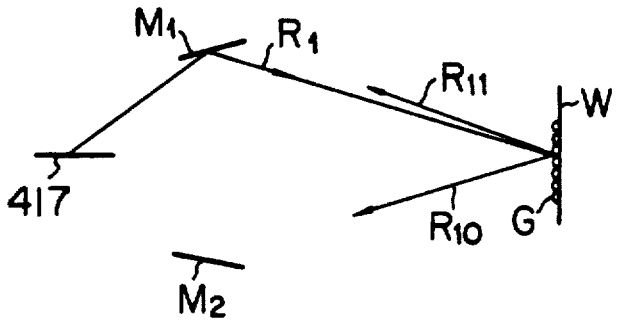
FIG. 44 is an illustration of the path of a reflected ray R1 after diffraction by the diffraction grid G in the exposure system.
Figure 45:
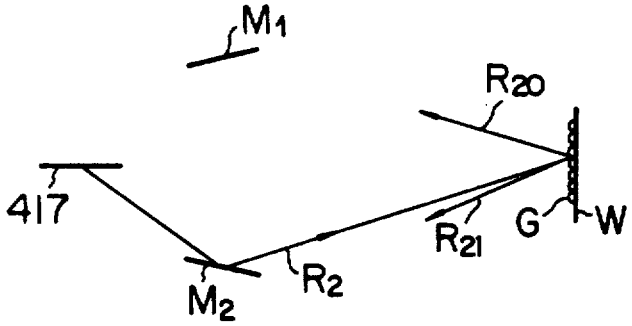
FIG. 45 is an illustration of the path of the reflected ray R2 after diffraction by the diffraction grid G2 in the exposure system.
Figure 46:
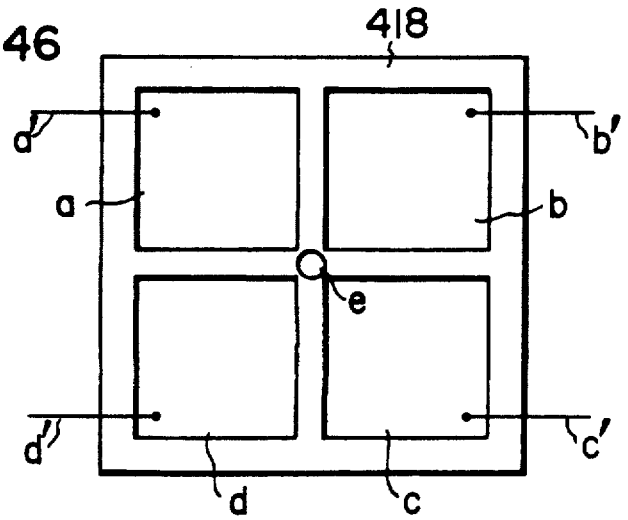
FIG. 46 is a plan view of a ray-receiving element as used in the exposure system.

As shown in FIG. 43, a diffraction grid G having a pitch P of, for example, 1 μm is formed on the surface of the area of the specimen W where the pattern is not to be formed, e.g. on the scribe line, such that the grid extend in parallel with the interference fringe formed as a result of mutual interference between two ray beams $R_1$, $R_2$. The diffracted rays $R_3$ and $R_4$ from the diffraction grid G impinge upon the photodetectors $D_1$ and $D_2$. The light of the reflected ray beam R is diffracted by the diffraction grid G so that a plurality of diffracted ray beams are formed. The area counter-clockwise from the direction of movement of the diffracted ray beam is considered as being of plus (+). As will be seen from FIG. 44, among the diffracted ray beams, the diffracted ray $R_{10}$ of 0 (zero) order and the diffracted ray $R_{11}$ of $-1$ order are reflected by reflecting mirrors $M_2$ and $M_1$ and come back to the laser source through a two rays split optic system 417, reflecting mirror 416 and the parallel optic system 425, as will be best seen from FIG. 49. Similarly, the light of the transmitted ray $R_2$ is diffracted by the diffraction grid G on the specimen into a plurality of diffracted rays. Among the plurality of diffracted rays, the diffracted ray beam $R_{20}$ of 0 (zero) order and the diffracted ray beam $R_{21}$ of $+1$ order are reflected by reflecting mirrors $M_1$ and $M_2$ and return to the laser source through the two ray beam splitting optic system 417, reflecting mirror 416 and the parallel optic system 415.

A reference numeral 418 denotes a light-receiving element for detecting the positions of returning lights of respective diffracted ray beams $R_{10}$, $R_{11}$, $R_{20}$, $R_{21}$. The light-receiving element 418 is disposed in the vicinity of the pin hole 414 and is composed of four separate light-receiving portions a, b, c and d, and the received lights in the form of electric signals are derived through respective lead lines a', b', c' and d'. A hole e for passing the ray beam R which has passed through the pin hole 414 is formed in the center of the light receiving element 418. The hole e is located on the optic axis.

Figure 47:
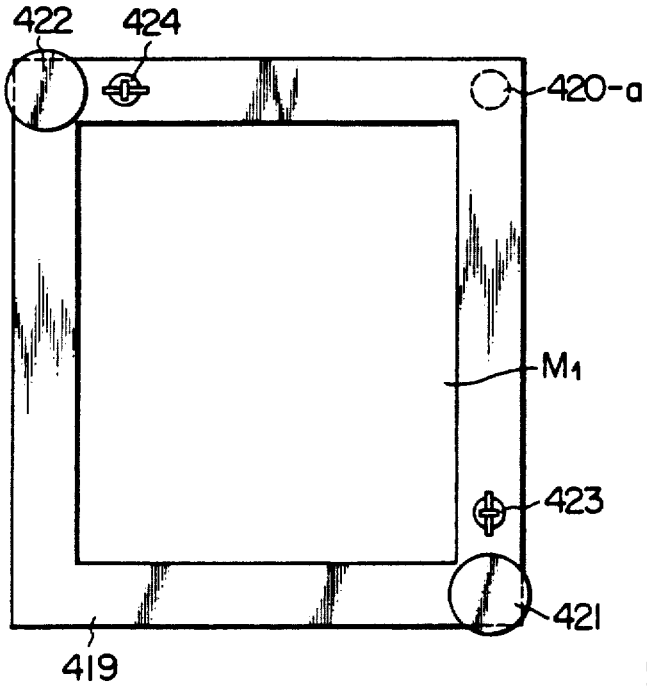
FIG. 47 is a front elevational view of reflecting mirrors M1 and M2 as used in the exposure system.
Figure 48:
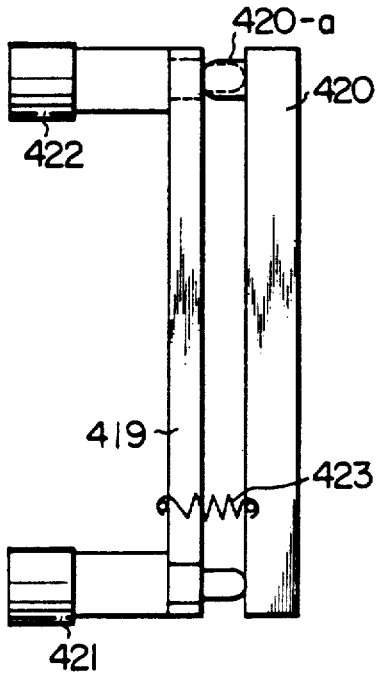
FIG. 48 is a side elevational view of the reflecting mirrors M1 and M2.

In order to permit adjustment of angles $\Phi_1$ and $\Phi_2$ of the reflecting mirrors $M_1$ and $M_2$, these mirrors $M_1$ and $M_2$ are provided with means for rotating these mirrors in the $\alpha$ and $\beta$ directions around the x axis and y axis, respectively, by representing the optic axis by $z$ as shown in FIGS. 47 and 48. More specifically, a reference numeral 419 designates a movable frame for fixing the reflecting mirror 420 denotes a support plate having a projection 420-$\alpha$ and 421, 422 denote micrometer heads fixed to the movable frame 419. The arrangement is such that, as the micrometer heads 421, 422 are operated, the ends 421-a, 422-a of these micrometer heads push the support plate 420 so that the reflecting mirror is rotated in the $\alpha$ and $\beta$ directions around the pivot constituted by the projection 420-a of the supporting plate 420, against the tensile forces produced by the tensile springs 423, 424.

Representing the wavelength of the laser beam by $\lambda$ and the pitch of the diffraction grid G on the wafer W by P, the diffraction angle $\Phi_{d1}$ at which the reflected ray $R_1$ is diffracted by the diffraction grid G is represented as follows by the Bragg condition.

$$P(\sin \Phi_{d1} - \sin \Phi_1) = m\lambda \tag{4}$$

where, m being 0, 1, 2, 3 and other positive integers.

In the case of m=0, i.e. the diffracted ray beam $R_{10}$ of 0 order, the diffraction angle $\Phi_{d10}$ is given by the following equation (5).

$$P(\sin \Phi_{d10} - \sin \Phi_1) = 0 \tag{5}$$

Thus, in this case, a condition of $\Phi_{10} = \Phi_1$ is obtained. Namely, the diffraction angle of the diffracted ray $R_{10}$ of 0 degree equals to the angle $\Phi_1$ of incidence of the reflected ray $R_1$, so that the diffracted light ray beam is returned to the laser source through the reflecting mirror $M_2$, two ray splitting optic system 417, reflecting mirror 416 and the parallel optic system 415.

When m=1, i.e. in the case of the diffracted ray $R_{11}$ of the 1st order, the diffraction angle $\Phi_{d11}$ is given as follows.

$$P(\sin \Phi_{d11} - \sin \Phi_1) = \lambda \tag{6}$$

If the condition of $\Phi_1 = -\Phi_{d11}$ is met, the following condition is obtained.

$$P = \frac{\lambda}{2 \sin \Phi_{d11}} \tag{7}$$

The diffraction angle $\Phi_{d2}$ at which the transmitted ray beam $R_2$ is diffracted by the diffraction grid G is derived from the Bragg condition as follows.

$$P(\sin \Phi_{d2} - \sin \Phi_2) = m\lambda \tag{8}$$

where, m is 0, 1, 2, 3 . . . and other positive integers.

In the case of m=0, i.e. the diffracted ray $R_{20}$ of 0 order, the diffraction angle $\Phi_{d20}$ is given by the following equation.

$$P(\sin \Phi_{d20} - \sin \Phi_2) = 0 \tag{9}$$

Thus, the condition of $\Phi_{d20} = \Phi_i$ is met. Thus, the diffraction angle $\Phi_{d20}$ of the diffracted ray $R_{20}$ of 0 (zero) order equals to the angle $\Phi_2$ of incidence of the transmitted ray $R_2$ so that the diffracted ray $R_{20}$ is returned to the laser source through the reflecting mirrors $M_1$, two ray beam splitting optic system 417, reflecting mirror 416 and parallel optic system 415.

In the case of m=1, i.e. in the case of the diffracted ray $R_{21}$ of the 1st order, the diffraction angle $\Phi_{d21}$ is given by the following formula.

$$P(\sin \Phi_{d21} - \sin \Phi_2) = \lambda \quad (10)$$

If the condition of $\Phi_{d21} = -\Phi_2$ is met, the following relationship is established.

$$P = \frac{\lambda}{2 \sin \Phi_{d21}} \quad (11)$$

Figure 49:
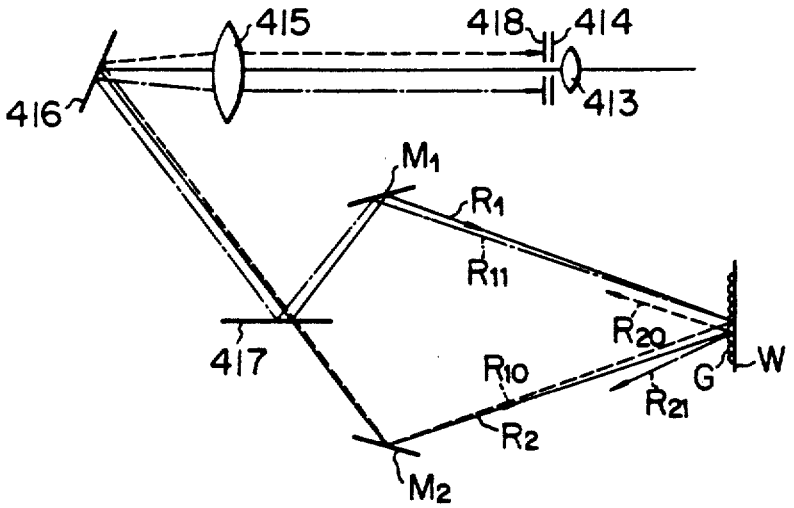
FIG. 49 is an illustration of the paths of the diffracted rays $R_{10}$, $R_{11}$, $R_{20}$ and $R_{21}$ under the condition of $\Phi_1 \neq (-\Phi_2)$, $\Phi_1 \neq (-\Phi_{d1})$ and $\Phi_2 \neq (-\Phi_{d21})$, in the exposure system.

If the conditions of $\Phi_1 \neq (-\Phi_2)$, $\Phi_1 \neq (-\Phi_{d1})$ and $\Phi_2 \neq (-\Phi_{d21})$ are met as shown in FIG. 49, the diffracted rays $R_{10}$, $R_{11}$, $R_{20}$ and $R_{21}$ after passing through the parallel optic system 415 do not pass through the hole e of the light receiving element 418 but impinge upon any one of the light-receiving portions a, b, c and d of the light receiving element 418. The intensities of ray beams received by respective light-receiving portions are converted into electric signals and are taken out as position information. Then, by suitably operating the rotary drive mechanisms for the reflecting mirrors $M_1$ and $M_2$, it is possible to realize the state in which none of the light-receiving portions a, b, c and d receive the diffracted ray, i.e. the state in which all of the diffracted rays pass through the hole e in the light-receiving element 417. This state is expressed by the following equation (12).

$$\Phi_1 \approx (-\Phi_2) \approx (-\Phi_{d1}) \approx (+\Phi_{d21}) \quad (12)$$

Representing the pitch of the interference fringe formed by interference between the reflected ray $R_1$ and the transmitted ray $R_2$ by $\Lambda$, this pitch is determined as follows.

$$\Lambda = \frac{\lambda}{\sin \phi_2 - \sin \phi_1} \quad (13)$$

The equation (13) is transformed as follows by a substitution of the equation (12).

$$\Lambda = \frac{\lambda}{2 \sin \phi_{d1}} \quad (14)$$

The equation (14) is further transformed as follows, using the equation (7).

$$\Lambda \approx \frac{\lambda}{2 \sin \phi_{d11}} = P \quad (15)$$

It is thus possible to obtain the pitch $\Lambda$ of the interference fringe of two ray beams $R_1$ and $R_2$ substantially equal to the pitch P of the diffraction grid G on the specimen W.

As the pitch $\Lambda$ of the interference fringe of two rays is made substantially equal to the pitch P of the diffraction grid G of the specimen, the diffraction grid G emits the ray beams $R_3$, $R_4$ which are formed as a result of the wave-surface splitting of the interference light of two ray beams $R_1$ and $R_2$, the splitting being made by the diffraction grid G. As a result, ray intensities which represent the positional relationship between the interference fringe of two ray beams and the grid at a high resolution can be obtained by photodetectors $D_1$ and $D_2$. Using these light intensities representing the positional relationships, it is possible to detect the positional relationship between the interference fringe of two ray beams and the specimen W, and the position of the specimen W, i.e. position of the same in the direction perpendicular to the interference fringe and rotation of the same around optic axis is corrected in accordance with the thus detected positional relationship, thereby to align the interference fringe of two ray beams $R_1$ and $R_2$ with the specimen W.

More specifically, by using an He-Cd laser beam of a wavelength of 4416 Å, it is possible to form interference fringe of a small pitch of 1 μm. Using this interference fringe in combination with a diffraction grid G of 1 μm pitch, it is possible to align the specimen such as a semiconductor wafer with the interference fringe at a high degree of accuracy of not greater than several hundreds of Å.

Thereafter, an exposure is made by exposing the portion of the specimen W, i.e. the semiconductor wafer, on which the pattern is to be formed. This pattern exposure can be conducted accurately by using, in combination with the aligning system of the invention explained hereinbefore, an exposure system having an exposing function which carries out the exposure method of the invention making use of interference of two laser beams. The exposure for forming fine patterns after the alignment may be conducted by a known exposure system such as a projection exposure system.

Although the light receiving system 418 used in the described embodiment has four separate light-receiving portions, the same effect can be produced by the use of a light-receiving element unit having four light-receiving elements fixed to a substrate made of a material which permits an easy formation of the central hole for passing ray beams.

In another modification, a light-receiving element, disposed in the vicinity of the pin hole 44, has light-receiving surfaces for receiving diffracted rays $R_{10}$, $R_{11}$, $R_{20}$ and $R_{21}$ arranged in a matrix-like form and provided at the center with a fine aperture for passing the ray beams. According to this arrangement, it is possible to obtain the positions to which the diffracted ray beams are returned as the position information of second order and, hence, to facilitate the coincidence of the pitch of the interference fringe with the pitch P of the diffraction grid G.

In a further modification, the light-receiving element 418 is disposed in the vicinity of the focal point of the diffraction optic system 413, so that the diffracted rays $R_{10}$, $R_{11}$, $R_{20}$, $R_{21}$ are returned to the light-receiving surface of the light-receiving element 418 in the most constricted state. With this arrangement, therefore, it is possible to make the pitch of the interference fringe coincide with the pitch P of the diffraction grid G accurately. By disposing the pin hole 414 and the light-receiving element 418 in the vicinity of the focal point of the diffusion optic system 413, it is possible to align the pitch of the interference fringe with the pitch P of the diffraction grid G highly accurately, while intercepting unnecessary diffracted ray portions.

As will be understood from the foregoing description, the present invention offers the following advantages.

According to the invention, interference fringe is formed by allowing two mutually conjugate ray beams to interfere with each other, and aligned with a grid formed on a wafer. The rays formed as a result of wave-surface splitting by the grid, i.e. the ray beam reflected by the grid and the ray beam transmitted by the grid are made to interfere with each other through a lens and the intensity of the interfered ray beam is measured. It is possible to know the positional relationship between the interference fringe and the grid by the measurement of the ray intensity, so that a highly accurate alignment can be attainable through this measurement. A high degree of accuracy of alignment is attainable by measuring the intensities of the sum and difference of diffracted ray beams from conjugate grids. By applying this technic to an exposure process employing laser holography, it is possible to effect the alignment and exposure, simultaneously without using any mask.

According to another feature of the invention, the interference fringe is made to align with a grid having a pitch which is n (n being an integer) times as large as the pitch of the interference fringe, and the ray beams formed by wave-surface splitting, i.e. reflection and transmission by the grid, are made to interfere again with each other and the intensity of the interferred ray beam is measured. Through this measurement of the ray intensity, it is possible to know the relative position between the interference fringe of two ray beams and the grid, so that a highly accurate alignment becomes attainable. By applying this technique to the exposure process employing laser holography, it is possible to effect the alignment and the exposure simultaneously without using any mask. The accuracy of the alignment in this case is on the order of several hundreds of Å when the pitch of the grid on the wafer is 1 μm.

In a practical form of the aligning method of the invention, the ray beams diffracted from the grid formed on a reticle is applied to a grid formed on a wafer, and the intensities of ray beam diffracted by the grid on the wafer are measured. By so doing, it is possible to align the pattern on the wafer with the reticle with a high degree of accuracy. Furthermore, it is possible to effect the alignment in a short period of time by making use of a figure pattern provided on the reticle or the wafer. A high degree of accuracy of alignment on the order of several hundreds of Å can be obtained when the pitch of the grid on the wafer is 1 μm. Although in the description of the embodiments the reticle and the wafer are assumed to be a first substrate and a second substrate, this embodiment can equally be applied to alignment of ordinary photo mask other than the reticle, with the wafer or even to alignment of ordinary two objects which are to aligned with each other. Although in the described embodiment the rays transmitted through the reticle is used, the invention can equally be carried out by making use of the rays reflected by the reticle.

According to an embodiment of the invention, the accuracy of detection by the photodetector can be enhanced by the following arrangement. Using the interference fringe formed as a result of interference between two ray beams and a grid, the rays reflected and transmitted by the grid are led to the photodetectors through slits which are disposed with their longer sides extending in parallel with the interference fringe, and the intensities of these ray beams are measured by the photodetectors. By so doing, it is possible to detect the degree of parallelness between the interference fringe of two ray beams and the grid, as well as relative position therebetween in the direction of the pitch, so that the alignment can be achieved at a specifically high accuracy on the order of less than 0.05 μm.

Furthermore, according to a further feature of the invention, interference fringe formed as a result of interference between mutually conjugate ray beams is aligned with a grid formed on a wafer, the grid having a pitch equal to or n (n being an integer) times as large as the pitch of the interference fringe. After completing this aligning operation, an exposure is conducted using the same system as that used for the alignment. This arrangement simplifies the system advantageously because the exposure is conducted by the same ray beam source as that used in the alignment, while ensuring the high degree of accuracy of the alignment inherent to the invention.

The invention permits a high degree of accuracy of alignment for forming fine pattern, even when the exposure is made by X-ray ion beams, ultraviolet rays and so forth.

In a further form of the invention, a diffraction grid on a specimen is positioned substantially in parallel with an interference fringe, and a plurality of diffracted ray beam diffracted by the diffraction grid are received by light-receiving elements which produce as their outputs the positional information. Then, by rotating, for example, two reflecting mirrors, the incidence angles of two ray beams to the diffraction grid are adjusted until the pitch of the interference fringe of two ray beams become substantially equal to the pitch of the diffraction grid. With this arrangement, it is possible to detect the relative position between the interference fringe of two ray beams and the specimen at a high accuracy of an order of less than several hundreds of Å. It is, therefore, possible to obtain an exposure system which can permits, in spite of the simplified construction, the formation of fine patterns of sub-micron order and at a large through-put, with a simple construction.

What is claimed is:

1. An aligning method comprising[:] the steps of: applying coherent ray beams from two directions to form *an* interference fringe through interference of said coherent ray beams; disposing a grid in the paths of said ray beams substantially in parallel with said interference fringe; allowing the ray beams *either* reflected [and] *or* transmitted by said grid to interfere again through an optic system and leading the interfered ray beam to photodetecting means; detecting the relative [position] *positions* between said interference fringe of said two ray beams and said grid through measuring the intensity of said interfered ray beam by said photodetecting means; and aligning said interference fringe and said grid with each other in accordance with the result of the measurement.

2. An aligning method according to claim 1, wherein said coherent ray beams have an equal wavelength.

3. An aligning method according to claim 1, comprising the step of detecting the diffracted ray reflected or transmitted by said grid.

4. An aligning method according to claim 1, wherein at [lest] *least* two photodetectors are provided *as said photodetecting means.*

5. An aligning method according to claim 4, wherein said photodetectors operate independently.

6. An aligning method according to claim 4, wherein said photodetecting means are adapted to detect mutually conjugate diffracted rays.

7. An aligning method according to claim 6, wherein the sum or difference of the outputs of said photodetecting means is used for the detection of the position.

8. An aligning method according to claim 1, wherein said photodetecting means is disposed on the focal point of an optic system which converges the ray beams diffracted by said grid.

9. An aligning method comprising: applying coherent ray beams from two directions to form [interferent] *an*

*interference* fringe through interference of said coherent ray [beam] *beams*, disposing a grid in the paths of said ray beams substantially in parallel with said interference fringe; allowing the ray beam *either* reflected and transmitted by said grid to interfere again through an optic system and leading the interfered ray beam to photodetecting means; changing the relative position between the interference fringe of two ray beams and said grid; detecting the amount of change of the relative position; and detecting the position by comparing the intensity of *the interfered* ray beam measured by said photodetecting means with the amount of change of the relative position.

10. An aligning method according to claim 9, wherein the position is detected by comparing the maximum and/or the minimum values of the ray intensity as measured by said photodetecting means with the deviation of said interference fringe and said grid.

11. An aligning method comprising: applying coherent ray beams from two directions to form *an* interference fringe through interference of said coherent [rays] *ray beams*, disposing a grid in the paths of said ray beams substantially in parallel with said interference fringe, said having a pitch which is n (n being an integer) times as large as the pitch of said interference fringe; leading the ray beams reflected or transmitted by said grid to photodetecting means; detecting the relative position between said interference fringe of said two ray beams and said grid through measuring the intensity of said ray beam reflected or transmitted by said grid by said photodetecting means; and aligning said grid with said interference fringe in accordance with the result of the measurement.

12. An aligning method according to claim 11, wherein a grid having a pitch which is n (n being an integer) times as large as the pitch of said interference fringe is formed by a photolithographic technique.

13. An aligning method according to claim 11, wherein a grid having a pitch which is n (n being an integer) times as large as the pitch of said interference fringe is formed by a [photolithographyic] *photolithographic* technique, and wherein a pattern beforehand positioned in relation to said grid is aligned with said interference fringe.

14. An aligning method according to claim 13, wherein a figure pattern of a period different from that of said grid is formed and, after making an approximate alignment using this figure pattern, said alignment of said grid and said interference fringe is conducted.

15. An aligning method comprising: applying a coherent first ray beam into *a* first one of two substrates to be aligned with each other, said first one of *the* substrates receiving said first coherent ray beam being provided on its surface with two first diffraction grids; applying second and third ray beams diffracted by *the* respective diffraction grids into the second one of the substrates; leading a fourth ray beam reflected or transmitted by a second diffraction grid on the surface of said second substrate to a photodetecting means and measuring the intensity of said fourth ray beam by said photodetecting means thereby to detect the relative position between the interference fringe of two ray beams applied to said second substrate and said second diffraction grid on said second substrate; and aligning said first substrate and said second substrate with each other using the detected relative position between said interference fringe and said second diffraction grid.

16. An aligning method according to claim 15, wherein a figure pattern of a period different from that of said second grid is formed in a part of said second grid on said second substrate and an approximate alignment is made using said figure pattern.

17. An aligning method according to claim 15, wherein, in parts of the regular first diffraction grids on said first substrate, *there are* formed [are] figure patterns of a period different from the periods of said first grids, said figure patterns being arranged in symmetry with respect to said first grids; the method comprising: applying two ray beams diffracted by respective first diffraction grids to said second diffraction grid on said second substrate; and effecting an approximate alignment using said figure pattern contained by the ray beam after diffraction by said second diffraction grid.

18. An aligning method comprising [:] the steps of: applying a coherent first ray beam into *a* first one of two substrates to be aligned with each other, said first one of *the* substrates receiving said first coherent ray beam being provided on its surface with a first diffraction grid; applying a second ray beam diffracted by said first diffraction grid into the second one of the substrates; applying a reference third ray beam interferable with said second ray beam to the second substrate; leading a fourth ray beam, which is formed by reflecting or transmitting said second and third ray beams by a second diffraction grid on said second substrate, to a photodetecting means and measuring the intensity of said fourth ray beam by said photodetecting means thereby to detect the relative position between the interference fringe of said second and third ray beams applied to said second substrate and said second diffraction grid on said second substrate; and aligning said first substrate and said second substrate with each other using the detected relative position between said interference fringe and said second diffraction grid.

19. An aligning method according to claim 18, wherein a figure pattern of a period different from that of said second grid is formed in a part of said second grid on said second substrate and an approximate alignment is made using said figure pattern.

20. An aligning method comprising: applying coherent ray beams from two directions to form *an* interference fringe by the mutual interference of the two ray beams; placing a grid in the optic paths of said two ray beams; leading the ray reflected or [diffracted] *transmitted* by said grid to a photo-detecting means through a slit to measure the intensity of said ray thereby to detect the relative position between said interference fringe and said grid; and aligning said interference fringe with said grid.

21. An aligning method according to claim 20, wherein said slit is disposed such that the longitudinal side of said slit extends substantially in parallel with said interference fringe of said two ray beams.

22. An aligning method according to claim 20, wherein said slit includes a first slit disposed with its longitudinal side extended substantially in parallel with said interference fringe of said two ray beams, a second slit inclined at a predetermined angle $\beta_1$ to said first slit and a third slit inclined at another predetermined angle $\beta_2$ to said first slit, the ray beams having passed through said three slits being introduced to respective photodetecting means for measuring intensities of *the* ray beams so that the direction of inclination of said grid with respect to said interference fringe of two *of said* ray beams is detected to permit the alignment of said interference fringe and said grid with each other.

23. An aligning method according to claim 20, wherein said grid is disposed in the vicinity of the point of intersection of scribe lines of an IC wafer, at 45° inclination to the scribe lines.

24. An aligning and exposing method comprising: applying coherent first radiant ray beams having a first wavelength from two directions; placing a grid disposed in the optic paths of said first radiant ray beams substantially in parallel with the interference fringe formed by mutual interference of two first radiant ray beams; allowing the ray beams *either* reflected [and] *or* transmitted by said grid to interfere again and leading the interfered ray beam to a photo-detecting means for the measurement of intensity of [said] *the interfered* ray beam; aligning said interference fringe of *the* two first radiant ray beams and said grid thereby to align a pattern formed on the same substrate as said grid; and effecting an exposure with a second radiant ray beam.

25. An aligning and exposing method according to claim 24, wherein said first radiant ray beam and said second radiant ray beam [has an] *have* equal [wavelength] *wavelengths.*

26. An aligning and exposing method according to claim 25, wherein said first radiant ray beam and said second radiant ray beam have different wavelengths.

27. An exposure method comprising: disposing a light-receiving element in the vicinity of a coherent ray beam; preparing an optic system capable of effecting an amplitude splitting of said ray beam and superposing the split ray components to make them interfere with each other; forming an interference fringe in a space by allowing two ray beams formed by the amplitude-splitting to interfere with each other; placing a diffraction grid in the optic paths of said two ray beams substantially in parallel with said interference fringe; returning the ray beams diffracted by said diffraction grid through said optic system; measuring the intensities of the returned ray beams by said light-receiving element; making an adjustment to substantially equalize the pitch of said interference fringe to the pitch of said diffraction grid by making use of the result of the measurement, thereby to align said interference fringe and said grid with each other; and exposing said interference fringe.

28. An exposure method comprising: allowing a coherent ray beam to pass through a diffusion optic system for diffusing said coherent ray beam; disposing a pin hole in the vicinity of the point where said ray beam is constricted by said diffusion optic system; disposing a light-receiving element in the vicinity of the ray beam which has passed through said pin hole; placing an optic system capable of making an amplitude splitting of said ray beam and superposing the ray beams formed by the splitting to make them interfere with each other; forming [the] *an* interference fringe in a space by allowing the rays formed by splitting to interfere with each other; disposing a diffraction grid in the optic paths of said ray beams formed by splitting substantially in parallel with said interference fringe; returning the ray beams diffracted by said diffraction grid through said optic system; measuring the intensities of the returned ray beams by said light-receiving element; effecting an adjustment to substantially equalize the pitch of said interference fringe with the pitch of said diffraction grid, aligning said grid with said interference fringe; and effecting an exposure.

*29. An aligning method, comprising the steps of applying coherent ray beams from two directions to form an interference fringe through interference of said coherent ray beams; disposing a grid in the paths of said ray beams substantially in parallel with said interference fringe; allowing the ray beams either reflected or transmitted by said grid to interfere again through an optic system and leading the interfered ray beam to photodetecting means; detecting the relative positions between said interference fringe of said two ray beams and said grid in accordance with a change in the output of said photo detecting means; and aligning said interference fringe and said grid with each other in accordance with the result of the measurement.*

*30. A method of aligning a reticle and a wafer provided with a grid, said grid being set on a wafer which is optically exposed through said reticle so as to be aligned with the latter, comprising the steps of applying coherent ray beams from two directions to form an interference fringe through interference of said coherent ray beams; disposing a grid in the paths of said ray beams substantially in parallel with said interference fringe; allowing the ray beams either reflected or transmitted by said grid to interfere again through an optic system and leading the interfered ray beam to photodetecting means; detecting the relative positions between said interference fringe of said two ray beams and said grid in accordance with a change in the output of said photodetecting means; and aligning said reticle and said wafer with each other in accordance with the result of the measurement.*

* * * * *